United States Patent
Oohashi

(10) Patent No.: US 8,728,709 B2
(45) Date of Patent: May 20, 2014

(54) LITHOGRAPHIC PRINTING PLATE PRECURSOR AND PLATE MAKING METHOD THEREOF

(75) Inventor: Hidekazu Oohashi, Shizuoka (JP)

(73) Assignee: FUJIFILM Corporation, Tokyo (JP)

( * ) Notice: Subject to any disclaimer, the term of this patent is extended or adjusted under 35 U.S.C. 154(b) by 23 days.

(21) Appl. No.: 13/405,601

(22) Filed: Feb. 27, 2012

(65) Prior Publication Data
US 2012/0219900 A1 Aug. 30, 2012

(30) Foreign Application Priority Data
Feb. 28, 2011 (JP) .................. 2011-043395

(51) Int. Cl.
G03F 7/00 (2006.01)
B41M 1/06 (2006.01)

(52) U.S. Cl.
USPC ............ 430/287.1; 430/302; 430/272.1; 101/463.1

(58) Field of Classification Search
USPC ............ 430/270.1, 302; 101/453, 463.1
See application file for complete search history.

(56) References Cited

U.S. PATENT DOCUMENTS

| 2002/0081529 A1* | 6/2002 | Sonokawa ................ 430/303 |
| 2002/0092436 A1 | 7/2002 | Tsuchiya et al. |
| 2007/0020563 A1 | 1/2007 | Inno |
| 2012/0160118 A1* | 6/2012 | Oohashi et al. ............. 101/453 |

FOREIGN PATENT DOCUMENTS

| JP | 2002-91016 A | 3/2002 |
| JP | 2003-222717 A | 8/2003 |
| JP | 2004-317543 A | 11/2004 |
| JP | 2007-58170 A | 3/2007 |
| JP | 2007-249036 A | 9/2007 |
| JP | 2012-42517 A | 3/2012 |
| WO | 2005/111727 A1 | 11/2005 |

OTHER PUBLICATIONS

English Translation of JP2007249036.*
Extended European Search Report issued on Jun. 28, 2012 in corresponding European patent application No. 12156832.3.

* cited by examiner

*Primary Examiner* — Cynthia H Kelly
*Assistant Examiner* — Anna Malloy
(74) *Attorney, Agent, or Firm* — Birch, Stewart, Kolasch & Birch, LLP

(57) ABSTRACT

A lithographic printing plate precursor includes a support and an image-recording layer containing a star polymer, a radical polymerizable compound and a radical polymerization initiator, the star polymer is a star polymer in which a polymer chain is branched from a central skeleton via a sulfide bond and the polymer chain contains an acid group and a crosslinkable group in a side chain of the polymer chain.

9 Claims, 2 Drawing Sheets

THREE-BRANCHED

FOUR-BRANCHED

FIVE-BRANCHED

SIX-BRANCHED

SEVENTH-BRANCHED

EIGHT-BRANCHED

NINE-BRANCHED

TEN-BRANCHED

LITHOGRAPHIC PRINTING PLATE PRECURSOR AND PLATE MAKING METHOD THEREOF

FIELD OF THE INVENTION

The present invention relates to a lithographic printing plate precursor and a plate making method using the same. More particularly, it relates to a lithographic printing plate precursor capable of undergoing a direct plate making by image exposure with laser and a plate making method comprising exposing and developing the lithographic printing plate precursor.

BACKGROUND OF THE INVENTION

In general, a lithographic printing plate has a surface composed of an oleophilic image area and a hydrophilic non-image area. Lithographic printing is a printing method comprising supplying alternately dampening water and oily ink on the surface of lithographic printing plate, making the hydrophilic non-image area a dampening water-receptive area (ink unreceptive area) and depositing the oily ink only on the oleophilic image area by utilizing the nature of water and oil to repel with each other, and then transferring the ink to a printing material, for example, paper.

In order to produce the lithographic printing plate, a lithographic printing plate precursor (PS plate) comprising a hydrophilic support having provided thereon an oleophilic image-recording layer has heretofore been broadly used. Ordinarily, a lithographic printing plate is obtained by conducting plate making by a method of exposing the lithographic printing plate precursor through an original, for example, a lith film, and then treating the exposed lithographic printing plate precursor to remove the image-recording layer in the unnecessary non-image area by dissolving with a an alkaline developer or an organic solvent thereby revealing a surface of the hydrophilic support to form the non-image area while leaving the image-recording layer in the image area.

In the hitherto known plate making process of lithographic printing plate precursor, after the exposure, the step of removing the unnecessary image-recording layer by dissolving, for example, with a developer is required. However, it is one of the subjects to simplify such an additional wet treatment as described above. As one means for the simplification, it has been desired to conduct the development with a nearly neutral aqueous solution or simply with water.

On the other hand, digitalized technique of electronically processing, accumulating and outputting image information using a computer has been popularized in recent years, and various new image outputting systems responding to the digitalized technique have been put into practical use.

Correspondingly, attention has been drawn to a computer-to-plate technique of carrying the digitalized image information on highly converging radiation, for example, laser light and conducting scanning exposure of a lithographic printing plate precursor with the light thereby directly preparing a lithographic printing plate without using a lith film. Thus, it is one of the important technical subjects to obtain a lithographic printing plate precursor adaptable to the technique described above.

Based on the background described above, adaptation of plate making operation to both simplification and digitalization has been demanded strongly more and more than ever before.

However, since the development processing ordinarily comprises three steps of developing with an aqueous alkali solution having pH of 10 or more, washing of the alkali agent with a water-washing bath and then treating with a gum solution mainly comprising a hydrophilic resin as described above, an automatic developing machine per se requires a large space and problems of the environment and running cost, for example, disposal of the development waste liquid, water-washing waste liquid and gum waste liquid still remain. Therefore, the decrease in alkali concentration of developer and the simplification of processing step have been further strongly required from both aspects of the consideration for global environment and the adaptation for space saving and low running cost.

For instance, a developing method with an alkali solution having pH from 10 to 12.5 and containing a nonionic surfactant is proposed in JP-A-2002-91016 (the term "JP-A" as used herein means an "unexamined published Japanese patent application"). However, since the photosensitive composition contains an alkali-soluble polymer, there is a problem in that the development can not be conducted with a developer having pH lower than the value defined.

A method of preparing a lithographic printing plate comprising exposing with laser of 350 to 450 nm a lithographic printing plate precursor having an image-recording layer containing (A) a sensitizing dye having an absorption maximum at a wavelength range from 350 to 450 nm, (B) a hexaarylbiimidazole compound, (C) a polymerizable compound, (D) a hydrophobic binder polymer and (E) a chain transfer agent and a protective layer in this order and then removing the protective layer and the unexposed area of the image-recording layer by rubbing the surface of the lithographic printing plate precursor with a rubbing member in an automatic processor equipped with the rubbing member in the presence of a developer having pH from 2 to 10 is described in JP-A-2007-58170.

A plate making method of a lithographic printing plate comprising exposing imagewise a lithographic printing plate precursor having a photopolymerizable layer on support having a hydrophilic surface or having a hydrophilic layer provided thereon by a plate setter and then treating with a gum solution an image-recording layer of the lithographic printing plate precursor in a gumming unit of an automatic developing machine to remove the unexposed area of the image-forming layer is described in WO 05/111727.

A lithographic printing plate precursor using a star polymer having an alkali-soluble group and a crosslinkable group is described in JP-A-2004-317543. There is described that development property and printing durability are improved by using the star polymer, but the effects are still insufficient.

In order to improve development property and printing durability of a lithographic printing plate precursor, use of a star polymer containing a repeating unit having a hydrophilic functional group and a repeating unit having a hydrophobic functional group in an image-recording layer is described in JP-A-2007-249036. Although the improvements in on-press development property and printing durability are achieved by using the star polymer, the effects are still insufficient.

SUMMARY OF THE INVENTION

An object of the present invention is to provide a lithographic printing plate precursor which exhibits high development property and provides excellent printing durability, and a plate making method using the lithographic printing plate precursor.

As a result of the intensive investigations for achieving the object described above, the inventors have found that a lithographic printing plate precursor excellent in both printing durability and development property can be obtained by using a star polymer which has a multifunctional thiol as a central skeleton and a polymer chain branched from the central skeleton via a sulfide bond, and the polymer chain contains an acid group and a crosslinkable group in its side chain to complete the invention.

The present invention includes the following items.

(1) A lithographic printing plate precursor comprising a support and an image-recording layer containing a star polymer, a radical polymerizable compound and a radical polymerization initiator, wherein the star polymer is a star polymer in which a polymer chain is branched from a central skeleton via a sulfide bond and the polymer chain contains an acid group and a crosslinkable group in its side chain.

(2) The lithographic printing plate precursor as described in (1) above, wherein the star polymer is a polymer in which from 3 to 10 polymer chains are branched from the central skeleton.

(3) The lithographic printing plate precursor as described in (1) or (2) above, wherein the acid group is selected from a carboxylic acid group, a phenolic hydroxy group, a sulfonamido group and a sulfonimido group.

(4) The lithographic printing plate precursor as described in any one of (1) to (3) above, wherein the star polymer is a polymer in which from 3 to 10 polymer chains containing an acid group and a crosslinkable group are branched from the central skeleton via sulfide bonds and which is obtained by polymerization of an ethylenically unsaturated monomer in the presence of a multifunctional thiol.

(5) The lithographic printing plate precursor as described in any one of (1) to (4) above, wherein an undercoat layer is provided between the support and the image-recording layer.

(6) The lithographic printing plate precursor as described in any one of (1) to (5) above, wherein a protective layer is provided on the image-recording layer.

(7) The lithographic printing plate precursor as described in any one of (1) to (6) above, wherein an unexposed area of the image-recording layer is capable of being removed with a developer having pH from 2 to 14.

(8) The lithographic printing plate precursor as described in (6) above, which is capable of removing after image exposure with laser, the protective layer and an unexposed area of the image-recording layer with one bath of a developer having pH from 2 to 14.

(9) A plate making method of a lithographic printing plate precursor comprising exposing imagewise the lithographic printing plate precursor as described in (7) above with laser, and then removing an unexposed area of the image-recording layer with a developer having pH from 2 to 14.

(10) A plate making method of a lithographic printing plate precursor comprising exposing imagewise the lithographic printing plate precursor as described in (8) above with laser, and then removing the protective layer and an unexposed area of the image-recording layer with one bath of a developer having pH from 2 to 14.

According to the present invention, a lithographic printing plate precursor which exhibits high development property and provides excellent printing durability, and a plate making method using the lithographic printing plate precursor can be provided.

DESCRIPTION OF REFERENCE NUMERALS AND SIGNS

Figure 1:
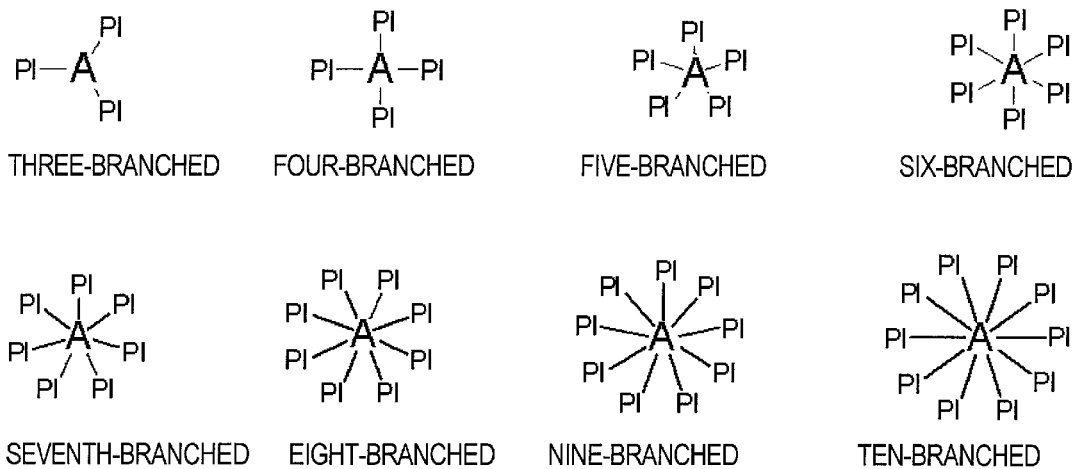
FIG. 1 is a view schematically showing a star polymer according to the invention.

61: Rotating brush roller
62: Backing roller
63: Transport roller
64: Transport guide plate
65: Spray pipe
66: Pipe line
67: Filter
68: Plate supply table
69: Plate discharge table
70: Developer tank
71: Circulating pump
72: Lithographic printing plate precursor

DETAILED DESCRIPTION OF THE INVENTION (A) Star Polymer

The star polymer for use in the invention is a polymer having a main chain structure as shown in the schematic view of FIG. 1. It has a structure in which one terminal of polymer chain P1 is connected to central skeleton A and is different from a graft polymer in which one terminal of a polymer chain is connected to a polymer chain.

[Central Skeleton]

The star polymer for use in the invention is a polymer in which polymer chains are branched from a central skeleton via sulfide bonds and which is obtained by polymerization of an ethylenically unsaturated monomer in the presence of a multifunctional thiol from the standpoint of ease in synthesis and performances of the polymer obtained. Specifically, a polymer having a hub portion which is a residue of a three or higher functional thiol as a central structure is preferred. In the idealized structure, a main chain of an addition polymer extends from each thio part of the hub portion and thus, three or more main chains extend from the thio parts. Specifically, the central skeleton A has preferably a structure represented by formula (1) shown below.

In formula (1), $A_1$ represents a trivalent or higher valent organic group, and n represents an integer of 3 or more. Specific examples of $A_1$ include trivalent or higher valent organic groups having structures shown below and trivalent or higher valent organic groups composed of combination of two or more of structures shown below. n is preferably an integer from 3 to 10, more preferably an integer from 3 to 8, and particularly preferably an integer from 3 to 6.

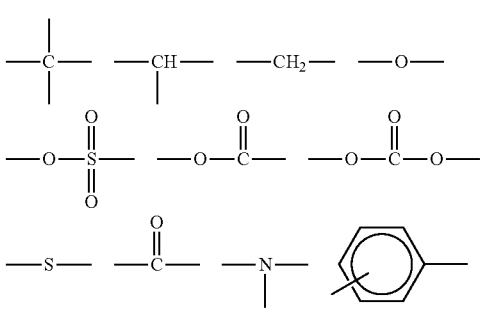

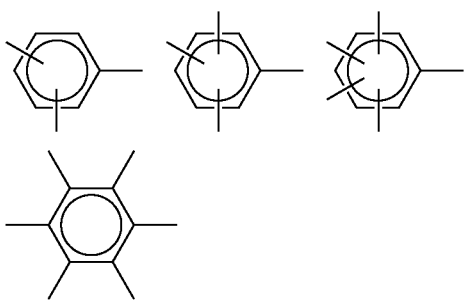

Polyvalent naphthalene, Polyvalent anthracene, —CH₃

The star polymer for use in the invention is a star polymer having the structure shown above which has a multifunctional thiol as central skeleton (A) and polymer chain (P1) connected to the central skeleton via a sulfide bond.

As the multifunctional thiol for use in the preparation of the star polymer according to the invention, any compound having three or more thiol groups in its molecule is suitably used. A multifunctional thiol having from 3 to 10 functional groups is preferred, a multifunctional thiol having from 3 to 8 functional groups is more preferred, and multifunctional thiol having from 3 to 6 functional groups is particularly preferred. The multifunctional thiol includes Compound A to Compound F described below.

(Compound A)

Compound A is a compound obtained by a method of reacting a sulfuration agent, for example, thiourea, potassium thiocyanate or thioacetic acid with an electrophilic agent, for example, a halide or a sulfonic acid ester of an alcohol, followed by various treatments. Specific examples of Compound A include compounds set forth below, but the invention should not be construed as being limited thereto.

(SA-1)
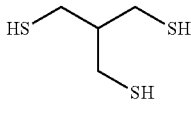

(SA-2)
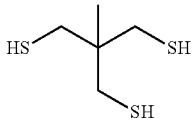

(SA-3)
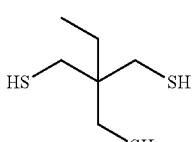

(SA-4)
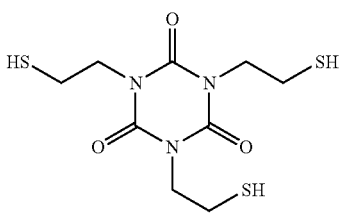

(SA-5)
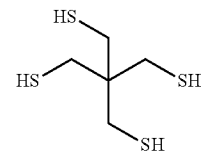

(SA-6)
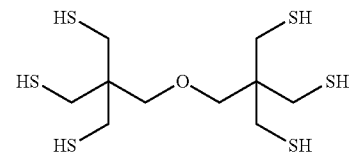

(SA-7)
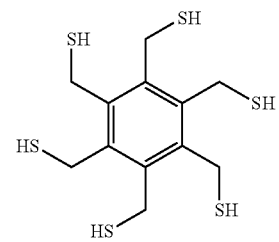

(SA-8)
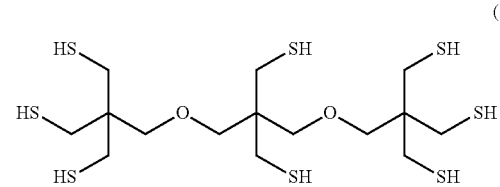

(Compound B)

Compound B is a compound obtained by a dehydration condensation reaction between a multifunctional alcohol and a carboxylic acid having a thiol group. Among them, a compound obtained by a dehydration condensation reaction between a multifunctional alcohol having from 3 to 10 functional groups and a mono-carboxylic acid having one thiol group is preferred.

Specific examples of the multifunctional alcohol include cyclohexanetriol (3), glycerol (3), 2-hydroxymethyl-1,3-propanediol (3), 1,1,1-tris(hydroxymethyl)ethane (3), 1,2,4-butanetriol (3), trimethylolpropane (3), 1,2,3-trihydroxyhexane (3), 1,2,6-trihydroxyhexane (3), 1,2,3-heptanetriol (3), pyrogallol (3), 1,2,4-benzenetriol (3), phloroglucinol (3), 1,1,1-tris(4-hydroxyphenyl)ethane (3), 1,3,5-tris(2-hydroxyethyl)isocyanurate (3), pentaerythritol (4), threitol (4), erythritol (4), xylulose (4), ribulose (4), quebrachitol (5), adonitol (5), arabitol (5), xylitol (5), catechin (5), epicatechine (5), inositol (6), sorbitol (6), mannitol (6), iditol (6), dulcitol (6), dipentaerythritol (6) and tripentaerythritol (8). The number shown in parentheses above denotes a number of the functional groups.

Of the multifunctional alcohols, cyclohexanetriol (3), glycerol (3), 2-hydroxymethyl-1,3-propanediol (3), 1,1,1-tris(hydroxymethyl)ethane (3), trimethylolpropane (3), phloroglucinol (3), 1,1,1-tris(4-hydroxyphenyl)ethane (3), 1,3,5-tris(2-hydroxyethyl)isocyanurate (3), pentaerythritol (4), catechin (5), epicatechin (5), inositol (6), dipentaerythritol (6) and tripentaerythritol (8) are preferred, cyclohexanetriol (3), 2-hydroxymethyl-1,3-propanediol (3), 1,1,1-tris(hydroxymethyl)ethane (3), trimethylolpropane (3), phloroglucinol (3), 1,1,1-tris(4-hydroxyphenyl)ethane (3), 1,3,5-tris(2-hydroxyethyl)isocyanurate (3), pentaerythritol (4), catechin (5), epicatechin (5), inositol (6), dipentaerythritol (6) and tripentaerythritol (8) are more preferred, and 1,3,5-tris(2- hydroxyethyl)isocyanurate (3), pentaerythritol (4), catechin (5), epicatechin (5), inositol (6), dipentaerythritol (6) and tripentaerythritol (8) are particularly preferred.

Specific examples of the carboxylic acid having an thiol group include mercaptoacetic acid, 3-mercaptopropionic acid, 2-mercaptopropionic acid, 3-mercaptoisobutyric acid, N-acetylcysteine, N-(2-mercaptopropionyl)glycine and thiosalicylic acid.

Of the compounds, mercaptoacetic acid, 3-mercaptopropionic acid, 2-mercaptopropionic acid, 3-mercaptoisobutyric acid, N-acetylcysteine and N-(2-mercaptopropionyl)glycine are preferred, 3-mercaptopropionic acid, 2-mercaptopropionic acid, 3-mercaptoisobutyric acid, N-acetylcysteine and N-(2-mercaptopropionyl)glycine are more preferred, and 3-mercaptopropionic acid, 3-mercaptoisobutyric acid, N-acetylcysteine and N-(2-mercaptopropionyl)glycine are particularly preferred.

Specific examples of the compound include compounds set forth below, but the invention should not be construed as being limited thereto.

SB-93 to SB-97, SB-100 to SB-104, SB-156 to SB-160, SB-163 to SB-167, SB-170 to SB-174, SB-205 to SB-209 and SB-212 to SB-216 are particularly preferred.

Since the multifunctional thiols described above have a long distance between the thiol groups and a small steric hindrance, the desired star structure can be formed.

(Compound C)

Compound C is a compound obtained by a dehydration condensation reaction between an amine and a carboxylic acid having a thiol group. Among them, a compound obtained by a condensation reaction between a multifunctional amine having from 3 to 10 functional groups and a mono-carboxylic acid having one thiol group is preferred.

Specific examples of the multifunctional amine include diethylenetriamine (3), N-(2-aminoethyl)-1,3-propanediamine (3), N-(3-aminopropyl)-1,3-propanediamine (3), spermidine (3), bis(hexamethylene)triamine (3), 4-(aminomethyl)-1,8-octanediamine (3), triethylenetetramine (4), 1,4,7,11-tetraazaundecane (4), N,N'-bis(3-aminopropyl) ethylenediamine (4), N,N'-bis(2-aminoethyl)-1,3-

TABLE 1

| | Carboxylic Acid Having Thiol Group | | | | | | |
|---|---|---|---|---|---|---|---|
| Multifunctional Alcohol | Mercapto-acetic Acid | 3-Mercapto-propionic Acid | 2-Mercapto-propionic Acid | 3-Mercapto-isobutyric Acid | N-Acetyl-cysteine | N-(2-Mercapto-propionyl) glycine | Thiosali-cylic Acid |
| Cyclohexanetriol (3) | SB-1 | SB-2 | SB-3 | SB-4 | SB-5 | SB-6 | SB-7 |
| Glycerol (3) | SB-8 | SB-9 | SB-10 | SB-11 | SB-12 | SB-13 | SB-14 |
| 2-Hydroxymethyl-1,3-propanediol (3) | SB-15 | SB-16 | SB-17 | SB-18 | SB-19 | SB-20 | SB-21 |
| 1,1,1-Tris(hydroxymethyl)ethane (3) | SB-22 | SB-23 | SB-24 | SB-25 | SB-26 | SB-27 | SB-28 |
| 1,2,4-Butanetriol (3) | SB-29 | SB-30 | SB-31 | SB-32 | SB-33 | SB-34 | SB-35 |
| Trimethylolpropane (3) | SB-36 | SB-37 | SB-38 | SB-39 | SB-40 | SB-41 | SB-42 |
| 1,2,3-Trihydroxyhexane (3) | SB-43 | SB-44 | SB-45 | SB-46 | SB-47 | SB-48 | SB-49 |
| 1,2,6-Trihydroxyhexane (3) | SB-50 | SB-51 | SB-52 | SB-53 | SB-54 | SB-55 | SB-56 |
| 1,2,3-Heptanetriol (3) | SB-57 | SB-58 | SB-59 | SB-60 | SB-61 | SB-62 | SB-63 |
| Pyrogallol (3) | SB-64 | SB-65 | SB-66 | SB-67 | SB-68 | SB-69 | SB-70 |
| 1,2,4-Benzenetriol (3) | SB-71 | SB-72 | SB-73 | SB-74 | SB-75 | SB-76 | SB-77 |
| Phloroglucinol (3) | SB-78 | SB-79 | SB-80 | SB-81 | SB-82 | SB-83 | SB-84 |
| 1,1,1-Tris(4-hydroxyphenyl)ethane (3) | SB-85 | SB-86 | SB-87 | SB-88 | SB-89 | SB-90 | SB-91 |
| 1,3,5-Tris(2-hydroxyethyl)isocyanurate (3) | SB-92 | SB-93 | SB-94 | SB-95 | SB-96 | SB-97 | SB-98 |
| Pentaerythritol (4) | SB-99 | SB-100 | SB-101 | SB-102 | SB-103 | SB-104 | SB-105 |
| Threitol (4) | SB-106 | SB-107 | SB-108 | SB-109 | SB-110 | SB-111 | SB-112 |
| Erythritol (4) | SB-113 | SB-114 | SB-115 | SB-116 | SB-117 | SB-118 | SB-119 |
| Xylulose (4) | SB-120 | SB-121 | SB-122 | SB-123 | SB-124 | SB-125 | SB-126 |
| Quebrachitol (5) | SB-127 | SB-128 | SB-129 | SB-130 | SB-131 | SB-132 | SB-133 |
| Adonitol (5) | SB-134 | SB-135 | SB-136 | SB-137 | SB-138 | SB-139 | SB-140 |
| Arabitol (5) | SB-141 | SB-142 | SB-143 | SB-144 | SB-145 | SB-146 | SB-147 |
| Xylitol (5) | SB-148 | SB-149 | SB-150 | SB-151 | SB-152 | SB-153 | SB-154 |
| Catechin (5) | SB-155 | SB-156 | SB-157 | SB-158 | SB-159 | SB-160 | SB-161 |
| Epicatechine (5) | SB-162 | SB-163 | SB-164 | SB-165 | SB-166 | SB-167 | SB-168 |
| Inositol (6) | SB-169 | SB-170 | SB-171 | SB-172 | SB-173 | SB-174 | SB-175 |
| Sorbitol (6) | SB-176 | SB-177 | SB-178 | SB-179 | SB-180 | SB-181 | SB-182 |
| Mannitol (6) | SB-183 | SB-184 | SB-185 | SB-186 | SB-187 | SB-188 | SB-189 |
| Iditol (6) | SB-190 | SB-191 | SB-192 | SB-193 | SB-194 | SB-195 | SB-196 |
| Dulcitol (6) | SB-197 | SB-198 | SB-199 | SB-200 | SB-201 | SB-202 | SB-203 |
| Dipentaerythritol (6) | SB-204 | SB-205 | SB-206 | SB-207 | SB-208 | SB-209 | SB-210 |
| Tripentaerythritol (8) | SB-211 | SB-212 | SB-213 | SB-214 | SB-215 | SB-216 | SB-217 |

Of the specific examples shown in Table 1, SB-1 to SB-34, SB-36 to SB-48, SB-50 to SB-55, SB-57 to SB-62, SB-64 to SB-69, SB-71 to SB-76, SB-78 to SB-111, SB-113 to SB-118, SB-120 to SB-125, SB-127 to SB-132, SB-134 to SB-139, SB-141 to SB-146, SB-148 to SB-153, SB-155 to SB-181, SB-183 to SB-188, SB-190 to SB-195, SB-197 to SB-202 and SB-204 to SB-217 are preferred, SB-1 to SB-6, SB-9 to SB-13, SB-15 to SB-20, SB-22 to SB-27, SB-36 to SB-41, SB-78 to SB-83, SB-85 to SB-90, SB-92 to SB-97, SB-99 to SB-104, SB-155 to SB-160, SB-162 to SB-167, SB-169 to SB-174, SB-204 to SB-209 and SB-211 to SB-216 are more preferred, and SB-2 to SB-6, SB-16 to SB-20, SB-23 to SB-27, SB-37 to SB-41, SB-79 to SB-83, SB-86 to SB-90, propanediamine (4), N,N'-bis(3-aminopropyl)-1,3-propanediamine (4), spermine (4), tris(2-aminoethyl)amine (3), tetraethylenepentamine (5), pentaethylenehexamine (6), 1,4,7-triazacyclononane (3), 1,5,9-triazacyclododecane (3), cyclene (4), 1,4,8,11-tetraazacyclotetradecane (4), 1,4,8,12-tetraazacyclopentadecane (4), hexacyclene (6), 3,3'-diaminobenzidine (4) and 1,2,4,5-benzenetetramine (4).

Of the multifunctional amines, 4-(aminomethyl)-1,8-octanediamine (3), triethylenetetramine (4), 1,4,7,11-tetraazaundecane (4), N,N'-bis(3-aminopropyl)ethylenediamine (4), N,N'-bis(2-aminoethyl)-1,3-propanediamine (4), N,N'-bis(3-aminopropyl)-1,3-propanediamine (4), spermine (4), tris(2-aminoethyl)amine (3), tetraethylenepentamine (5), pentaethylenehexamine (6), cyclene (4) and hexacyclene (6) are preferred, 4-(aminomethyl)-1,8-octanediamine (3), tris(2-aminoethyl)amine (3), tetraethylenepentamine (5), pentaethylenehexamine (6), cyclene (4) and hexacyclene (6) are more preferred, and tetraethylenepentamine (5), pentaethylenehexamine (6), cyclene (4) and hexacyclene (6) are particularly preferred.

Specific examples of the carboxylic acid having a thiol group include the carboxylic acids described for Compound B above. Specific examples of Compound C include compounds set forth below, but the invention should not be construed as being limited thereto.

hydroxy group and amino group and a mono-carboxylic acid having one thiol group is preferred.

Specific examples of the multifunctional alcoholamine include diethanolamine (3), serinol (3), diisopropanolamine (3), 2-amino-2-ethyl-1,3-propanediol (3), 2-amino-2-methyl-1,3-propanediol (3), tris(hydroxymethyl)aminomethane (4), bishomotris (4), 1,3-diamino-2-hydroxypropane (3), 2-(2-aminoethylamino)ethanol (3), N,N'-bis(2-hydroxyethyl)ethylenediamine (4), 1,3-bis[tris(hydroxymethyl)methylamino]propane (8), 1-amino-1-deoxy-D-sorbitol (6), N-methyl-D-glucamine (6), 2,3-diaminophenol (3), 4-aminoresorcinol (3), norphenylephrine (3), octopamine (3), syn-

TABLE 2

| | Carboxylic Acid Having Thiol Group | | | | | | |
|---|---|---|---|---|---|---|---|
| Multifunctional Amine | Mercaptoacetic Acid | 3-Mercaptopropionic Acid | 2-Mercaptopropionic Acid | 3-Mercaptoisobutyric Acid | N-Acetylcysteine | N-(2-Mercaptopropionyl) glycine | Thiosalicylic Acid |
| Diethylenetriamine (3) | SC-1 | SC-2 | SC-3 | SC-4 | SC-5 | SC-6 | SC-7 |
| N-(2-Aminoethyl)-1,3-propanediamine (3) | SC-8 | SC-9 | SC-10 | SC-11 | SC-12 | SC-13 | SC-14 |
| N-(3-Aminopropyl)-1,3-propanediamine (3) | SC-15 | SC-16 | SC-17 | SC-18 | SC-19 | SC-20 | SC-21 |
| Spermidine (3) | SC-22 | SC-23 | SC-24 | SC-25 | SC-26 | SC-27 | SC-28 |
| Bis(hexamethylene)triamine (3) | SC-29 | SC-30 | SC-31 | SC-32 | SC-33 | SC-34 | SC-35 |
| 4-(Aminomethyl)-1,8-octanediamine (3) | SC-36 | SC-37 | SC-38 | SC-39 | SC-40 | SC-41 | SC-42 |
| Triethylenetetramine (4) | SC-43 | SC-44 | SC-45 | SC-46 | SC-47 | SC-48 | SC-49 |
| 1,4,7,11-Tetraazaundecane (4) | SC-50 | SC-51 | SC-52 | SC-53 | SC-54 | SC-55 | SC-56 |
| N,N'-Bis(3-aminopropyl)ethylenediamine (4) | SC-57 | SC-58 | SC-59 | SC-60 | SC-61 | SC-62 | SC-63 |
| N,N'-Bis(2-aminoethyl)-1,3-propanediamine (4) | SC-64 | SC-65 | SC-66 | SC-67 | SC-68 | SC-69 | SC-70 |
| N,N'-Bis(3-aminopropyl)-1,3-propanediamine (4) | SC-71 | SC-72 | SC-73 | SC-74 | SC-75 | SC-76 | SC-77 |
| Spermine (4) | SC-78 | SC-79 | SC-80 | SC-81 | SC-82 | SC-83 | SC-84 |
| Tris(2-aminoethyl)amine (3) | SC-85 | SC-86 | SC-87 | SC-88 | SC-89 | SC-90 | SC-91 |
| Tetraethylenepentamine (5) | SC-92 | SC-93 | SC-94 | SC-95 | SC-96 | SC-97 | SC-98 |
| Pentaethylenehexamine (6) | SC-99 | SC-100 | SC-101 | SC-102 | SC-103 | SC-104 | SC-105 |
| 1,4,7-Triazacyclononane (3) | SC-106 | SC-107 | SC-108 | SC-109 | SC-110 | SC-111 | SC-112 |
| 1,5,9-Triazacyclododecane (3) | SC-113 | SC-114 | SC-115 | SC-116 | SC-117 | SC-118 | SC-119 |
| Cyclene (4) | SC-120 | SC-121 | SC-122 | SC-123 | SC-124 | SC-125 | SC-126 |
| 1,4,8,11-Tetraazacyclotetradecane (4) | SC-127 | SC-128 | SC-129 | SC-130 | SC-131 | SC-132 | SC-133 |
| 1,4,8,12-Tetraazacyclopentadecane (4) | SC-134 | SC-135 | SC-136 | SC-137 | SC-138 | SC-139 | SC-140 |
| Hexacyclene (6) | SC-141 | SC-142 | SC-143 | SC-144 | SC-145 | SC-146 | SC-147 |

Of the compounds shown in Table 2, SC-1 to SC-6, SC-8 to SC-13, SC-15 to SC-20, SC-22 to SC-27, SC-29 to SC-34, SC-36 to SC-111, SC-113 to SC-118, SC-120 to SC-132, SC-134 to SC-139 and SC-141 to SC-147 are preferred, SC-37 to SC-41, SC-44 to SC-48, SC-51 to SC-55, SC-58 to SC-62, SC-65 to SC-69, SC-72 to SC-76, SC-79 to SC-83, SC-86 to SC-90, SC-93 to SC-97, SC-100 to SC-104, SC-121 to SC-125 and SC-142 to SC-146 are more preferred, and SC-37 to SC-41, SC-86 to SC-90, SC-93 to SC-97, SC-100 to SC-104, SC-121 to SC-125 and SC-142 to SC-146 are particularly preferred.

Since the multifunctional thiols described above have a long distance between the thiol groups and a small steric hindrance, the desired star structure can be formed.
(Compound D)

Compound D is a compound obtained by a dehydration condensation reaction between a compound having a hydroxy group and an amino group and a carboxylic acid having a thiol group. Among them, a compound obtained by a dehydration condensation reaction between a multifunctional alcoholamine having from 3 to 10 functional groups of ephrine (3), 3,4-dihydroxybenzylamine (3), 3-hydroxytyramine (3), norepinephrine (4), 5-hydroxydopamine (4) and 6-hydroxydopamine (4), and of the multifunctional alcoholamines, serinol (3), 2-amino-2-methyl-1,3-propanediol (3), tris(hydroxymethyl)aminomethane (4), bishomotris (4), 1,3-diamino-2-hydroxypropane (3), N,N'-bis(2-hydroxyethyl)ethylenediamine (4), 1,3-bis[tris(hydroxymethyl)methylamino]propane (8), 1-amino-1-deoxy-D-sorbitol (6), N-methyl-D-glucamine (6), norepinephrine (4), 5-hydroxydopamine (4) and 6-hydroxydopamine (4) are preferred, and tris(hydroxymethyl)aminomethane (4), bishomotris (4), N,N'-bis(2-hydroxyethyl)ethylenediamine (4), 1,3-bis[tris(hydroxymethyl)methylamino]propane (8), 1-amino-1-deoxy-D-sorbitol (6), N-methyl-D-glucamine (6), norepinephrine (4), 5-hydroxydopamine (4) and 6-hydroxydopamine (4) are particularly preferred.

Specific examples of the carboxylic acid having a thiol group include the carboxylic acids described for Compound B above. Specific examples of Compound D include compounds set forth below, but the invention should not be construed as being limited thereto.

TABLE 3

| | Carboxylic Acid Having Thiol Group | | | | | | |
|---|---|---|---|---|---|---|---|
| Multifunctional Alcoholamine | Mercapto-acetic Acid | 3-Mercapto-propionic Acid | 2-Mercapto-propionic Acid | 3-Mercapto-isobutyric Acid | N-Acetyl-cysteine | N-(2-Mercapto-propionyl) glycine | Thiosali-cylic Acid |
| Diethanolamine (3) | SD-1 | SD-2 | SD-3 | SD-4 | SD-5 | SD-6 | SD-7 |
| Serinol (3) | SD-8 | SD-9 | SD-10 | SD-11 | SD-12 | SD-13 | SD-14 |
| Diisopropanolamine (3) | SD-15 | SD-16 | SD-17 | SD-18 | SD-19 | SD-20 | SD-21 |
| 2-Amino-2-ethyl-1,3-propanediol (3) | SD-22 | SD-23 | SD-24 | SD-25 | SD-26 | SD-27 | SD-28 |
| 2-Amino-2-methyl-1,3-propanediol (3) | SD-29 | SD-30 | SD-31 | SD-32 | SD-33 | SD-34 | SD-35 |
| Tris(hydroxymethyl)aminomethane (4) | SD-36 | SD-37 | SD-38 | SD-39 | SD-40 | SD-41 | SD-42 |
| Bishomotris (4) | SD-43 | SD-44 | SD-45 | SD-46 | SD-47 | SD-48 | SD-49 |
| 1,3-Diamino-2-hydroxypropane (3) | SD-50 | SD-51 | SD-52 | SD-53 | SD-54 | SD-55 | SD-56 |
| 2-(2-Aminoethylamino)ethanol (3) | SD-57 | SD-58 | SD-59 | SD-60 | SD-61 | SD-62 | SD-63 |
| N,N'-Bis(2-hydroxyethyl)ethylenediamine (4) | SD-64 | SD-65 | SD-66 | SD-67 | Sd-68 | SD-69 | SD-70 |
| 1,3-Bis[tris(hydroxymethyl)methylamino]propane (8) | SD-71 | SD-72 | SD-73 | SD-74 | SD-75 | SD-76 | SD-77 |
| 1-Amino-1-deoxy-D-sorbitol (6) | SD-78 | SD-79 | SD-80 | SD-81 | SD-82 | SD-83 | SD-84 |
| N-Methyl-D-glucamine (6) | SD-85 | SD-86 | SD-87 | SD-88 | SD-89 | SD-90 | SD-91 |
| 2,3-Diaminophenol (3) | SD-92 | SD-93 | SD-94 | SD-95 | SD-96 | SD-97 | SD-98 |
| 4-Aminoresorcinol (3) | SD-99 | SD-100 | SD-101 | SD-102 | SD-103 | SD-104 | SD-105 |
| Norphenylephrine (3) | SD-106 | SD-107 | SD-108 | SD-109 | SD-110 | SD-111 | SD-112 |
| Octopamine (3) | SD-113 | SD-114 | SD-115 | SD-116 | SD-117 | SD-118 | SD-119 |
| Synephrine (3) | SD-120 | SD-121 | SD-122 | SD-123 | SD-124 | SD-125 | SD-126 |
| 3,4-Dihydroxybenzylamine (3) | SD-127 | SD-128 | SD-129 | SD-130 | SD-131 | SD-132 | SD-133 |
| 3-Hydroxytyramine (3) | SD-134 | SD-135 | SD-136 | SD-137 | SD-138 | SD-139 | SD-140 |
| Norepinephrine (4) | SD-141 | SD-142 | SD-143 | SD-144 | SD-145 | SD-146 | SD-147 |
| 5-Hydroxydopamine (4) | SD-148 | SD-149 | SD-150 | SD-151 | SD-152 | SD-153 | SD-154 |
| 6-Hydroxydopamine (4) | SD-155 | SD-156 | SD-157 | SD-158 | SD-159 | SD-160 | SD-161 |

Of the compounds shown in Table 3, SD-1 to SD-6, SD-8 to SD-20, SD-22 to SD-27, SD-29 to SD-62, SD-64 to SD-97, SD-99 to SD-104, SD-106 to SD-111, SD-113 to SD-118, SD-120 to SD-125, SD-127 to SCD-132, SD-134 to SD-139 and SD-141 to SD-161 are preferred, SD-9 to SD-13, SD-30 to SD-34, SD-37 to SD-41, SD-44 to SD-48, SD-51 to SD-55, SD-65 to SD-69, SD-72 to SD-76, SD-79 to SD-83, SD-86 to SD-90, SD-142 to SD-146, SD-149 to SD-153 and SD-156 to SD-160 are more preferred, and SD-37 to SD-41, SD-44 to SD-48, SD-65 to SD-69, SD-72 to SD-76, SD-79 to SD-83, SD-86 to SD-90, SD-142 to SD-146, SD-149 to SD-153 and SD-156 to SD-160 are particularly preferred.

Since the multifunctional thiols described above have a long distance between the thiol groups and a small steric hindrance, the desired star structure can be formed.

(Compound E)

Compound E is a compound obtained by a dehydration condensation reaction between a multifunctional carboxylic acid and an alcohol having a thiol group. Among them, a compound obtained by a dehydration condensation reaction between a multifunctional carboxylic acid having from 2 to 10 functional groups and an alcohol having one or more thiol groups is preferred.

Specific examples of the multifunctional carboxylic acid include oxalic acid (2), malonic acid (2), methylmalonic acid (2), succinic acid (2), methylsuccinic acid (2), glutaric acid (2), adipic acid (2), pimelic acid (2), suberic acid (2), azelaic acid (2), sebacic acid (2), tricarballylic acid (3), 1,2,3,4-butanetetracarboxylic acid (4), aconitic acid (3), hexafluoroglutaric acid (2), malic acid (2), tartaric acid (2), citric acid (3), diglycolic acid (2), 3,6-dioxaoctanedicarboxylic acid (2), tetrahydrofuran-2,3,4,5-tetracarboxylic acid (4), mercaptosuccinic acid (2), thioglycolic acid (2), 2,2',2'',2'''-[1,2-ethanediylidenetetrakis(thio)]tetrakisacetic acid (4), 1,3,5-cyclohexanetricarboxylic acid (3), 1,2,3,4-cyclobutanetetracarboxylic acid (4), 1,2,3,4,5,6-cyclohexanehexacarboxylic acid (6), 1,2-phenylenediacetic acid (2), 1,2-phenylenedioxydiacetic acid (2), homophthalic acid (2), 1,3-phenylenediacetic acid (2), 4-carboxyphenoxyacetic acid (2), 1,4-phenylenediacetic acid (2), 1,4-phenylenedipropionic acid (2), phthalic acid (2), isophthalic acid (2), terephthalic acid (2), 1,2,3-benzenetricarboxylic acid (3), 1,2,4-benzenetricarboxylic acid (3), 1,3,5-benzenetricarboxylic acid (3), 1,2,4,5-benzenetetracarboxylic acid (4), mellitic acid (6) and 1,4,5,8-naphthalenetetracarboxylic acid (4), and of the multifunctional carboxylic acids, tricarballylic acid (3), 1,2,3,4-butanetetracarboxylic acid (4), aconitic acid (3), citric acid (3), tetrahydrofuran-2,3,4,5-tetracarboxylic acid (4), mercaptosuccinic acid (2), 2,2',2'',2'''-[1,2-ethanediylidenetetrakis(thio)]tetrakisacetic acid (4), 1,3,5-cyclohexanetricarboxylic acid (3), 1,2,3,4-cyclobutanetetracarboxylic acid (4), 1,2,3,4,5,6-cyclohexanehexacarboxylic acid (6), 1,2-phenylenediacetic acid (2), 1,2-phenylenedioxydiacetic acid (2), 1,3-phenylenediacetic acid (2), 1,4-phenylenediacetic acid (2), 1,4-phenylenedipropionic acid (2), phthalic acid (2), isophthalic acid (2), terephthalic acid (2), 1,3,5-benzenetricarboxylic acid (3), 1,2,4,5-benzenetetracarboxylic acid (4), mellitic acid (6) and 1,4,5,8-naphthalenetetracarboxylic acid (4) are preferred, and tricarballylic acid (3), 1,2,3,4-butanetetracarboxylic acid (4), tetrahydrofuran-2,3,4,5-tetracarboxylic acid (4), mercaptosuccinic acid (2), 2,2',2'',2'''-[1,2-ethanediylidenetetrakis(thio)]tetrakisacetic acid (4), 1,3,5-cyclohexanetricarboxylic acid (3), 1,2,3,4-cyclobutanetetracarboxylic acid (4), 1,2,3,4,5,6-cyclohexanehexacarboxylic acid (6), 1,3,5-benzenetricarboxylic acid (3), 1,2,4,5-benzenetetracarboxylic acid (4), mellitic acid (6) and 1,4,5,8-naphthalenetetracarboxylic acid (4) are particularly preferred.

Specific examples of the alcohol having a thiol group include 2-mercaptoethanol (1), 1-mercapto-2-propanol (1), 3-mercapto-1-propanol (1), 3-mercapto-2-butanol (1), 2,3-dimercapto-1-propanol (2) and 4-hydroxythiophenol (1), and of the alcohols having a thiol group, 2-mercaptoethanol (1), 3-mercapto-1-propanol (1) and 2,3-dimercapto-1-propanol (2) are preferred, 2-mercaptoethanol (1) and 3-mercapto-1-propanol (1) are more preferred, and 3-mercapto-1-propanol (1) is particularly preferred.

Specific examples of Compound E include compounds shown in Tables 4 and 5 below, but the invention should not be construed as being limited thereto.

TABLE 4

| Multifunctional Carboxylic Acid | Alcohol Having Thiol Group | | | | | |
| --- | --- | --- | --- | --- | --- | --- |
| | 2-Mercapto ethanol | 1-Mercapto-2-propanol | 3-Mercapto-1-propanol | 3-Mercapto-2-butanol | 2,3-Dimercapto-1-propanol | 4-Hydroxy-thiophenol |
| Oxalic acid (2) | — | — | — | — | SE-1 | — |
| Malonic acid (2) | — | — | — | — | SE-2 | — |
| Methylmalonic acid (2) | — | — | — | — | SE-3 | — |
| Succinic acid (2) | — | — | — | — | SE-4 | — |
| Methylsuccinic acid (2) | — | — | — | — | SE-5 | — |
| Glutaric acid (2) | — | — | — | — | SE-6 | — |
| Adipic acid (2) | — | — | — | — | SE-7 | — |
| Pimelic acid (2) | — | — | — | — | SE-8 | — |
| Suberic acid (2) | — | — | — | — | SE-9 | — |
| Azelaic acid (2) | — | — | — | — | SE-10 | — |
| Sebacic acid (2) | — | — | — | — | SE-11 | — |
| Tricarballylic acid (3) | SE-12 | SE-13 | SE-14 | SE-15 | SE-16 | SE-17 |
| 1,2,3,4-Butanetetracarboxylic acid (4) | SE-18 | SE-19 | SE-20 | SE-21 | SE-22 | SE-23 |
| Aconitic acid (3) | SE-24 | SE-25 | SE-26 | SE-27 | SE-28 | SE-29 |
| Hexafluoroglutaric acid (2) | — | — | — | — | SE-30 | — |
| Malic acid (2) | — | — | — | — | SE-31 | — |
| Tartaric acid (2) | — | — | — | — | SE-32 | — |
| Citric acid (3) | SE-33 | SE-34 | SE-35 | SE-36 | SE-37 | SE-38 |
| Diglycolic acid (2) | — | — | — | — | SE-39 | — |
| 3,6-Dioxaoctanedicarboxylic acid (2) | — | — | — | — | SE-40 | — |
| Tetrahydrofuran-2,3,4,5-tetracarboxylic acid (4) | SE-41 | SE-42 | SE-43 | SE-44 | SE-45 | SE-46 |
| Mercaptosuccinic acid (2) | SE-119 | SE-120 | SE-121 | SE-122 | SE-47 | SE-123 |
| Thioglycolic acid (2) | — | — | — | — | SE-48 | — |
| 2,2',2'',2'''-[1,2-Ethanediylidenetetrakis(thio)] tetrakisacetic acid (4) | SE-49 | SE-50 | SE-51 | SE-52 | SE-53 | SE-54 |

TABLE 5

| Multifunctional Carboxylic Acid | Alcohol Having Thiol Group | | | | | |
| --- | --- | --- | --- | --- | --- | --- |
| | 2-Mercapto-ethanol | 1-Mercapto-2-propanol | 3-Mercapto-1-propanol | 3-Mercapto-2-butanol | 2,3-Dimercapto-1-propanol | 4-Hydroxy-thiophenol |
| 1,3,5-Cyclohexanetricarboxylic acid (3) | SE-55 | SE-56 | SE-57 | SE-58 | SE-59 | SE-60 |
| 1,2,3,4-Cyclobutanetetracarboxylic acid (4) | SE-61 | SE-62 | SE-63 | SE-64 | SE-65 | SE-66 |
| 1,2,3,4,5,6-Cyclohexanehexacarboxylic acid (6) | SE-67 | SE-68 | SE-69 | SE-70 | SE-71 | SE-72 |
| 1,2-Phenylenediacetic acid (2) | — | — | — | — | SE-73 | — |
| 1,2-Phenylenedioxydiacetic acid (2) | — | — | — | — | SE-74 | — |
| Homophthalic acid (2) | — | — | — | — | SE-75 | — |
| 1,3-Phenylenediacetic acid (2) | — | — | — | — | SE-76 | — |
| 4-Carboxyphenoxyacetic acid (2) | — | — | — | — | SE-77 | — |
| 1,4-Phenylenediacetic acid (2) | — | — | — | — | SE-78 | — |
| 1,4-Phenylenedipropionic acid (2) | — | — | — | — | SE-79 | — |
| Phthalic acid (2) | — | — | — | — | SE-80 | — |
| Isophthalic acid (2) | — | — | — | — | SE-81 | — |
| Terephthalic acid (2) | — | — | — | — | SE-82 | — |
| 1,2,3-Benzenetricarboxylic acid (3) | SE-83 | SE-84 | SE-85 | SE-86 | SE-87 | SE-88 |
| 1,2,4-Benzenetricarboxylic acid (3) | SE-89 | SE-90 | SE-91 | SE-92 | SE-93 | SE-94 |
| 1,3,5-Benzenetricarboxylic acid (3) | SE-95 | SE-96 | SE-97 | SE-98 | SE-99 | SE-100 |
| 1,2,4,5-benzenetetracarboxylic acid (4) | SE-101 | SE-102 | SE-103 | SE-104 | SE-105 | SE-106 |
| Mellitic acid (6) | SE-107 | SE-108 | SE-109 | SE-110 | SE-111 | SE-112 |
| 1,4,5,8-Naphthalenetetracarboxylic acid (4) | SE-113 | SE-114 | SE-115 | SE-116 | SE-117 | SE-118 |

Of the compounds shown in Tables 4 and 5, SE-12, SE-14, SE-16, SE-18, SE-20, SE-22, SE-24, SE-26, SE-33, SE-35, SE-41, SE-43, SE-45, SE-119, SE-121, SE-47, SE-49, SE-51, SE-53, SE-55, SE-57, SE-59, SE-61, SE-63, SE-65, SE-67, SE-69, SE-71, SE-83, SE-85, SE-89, SE-91, SE-95, SE-97, SE-99, SE-101, SE-103, SE-105, SE-107, SE-109, SE-111, SE-113, SE-115 and SE-117 are preferred, and SE-12, SE-14, SE-18, SE-20, SE-41, SE-43, SE-119, SE-121, SE-49, SE-51, SE-55, SE-57, SE-61, SE-63, SE-67, SE-69, SE-95, SE-97, SE-101, SE-103, SE-107, SE-109, SE-113 and SE-115 are more preferred.

Since the multifunctional thiols described above have a long distance between the thiol groups and a small steric hindrance, the desired star structure can be formed.

(Compound F)

Compound F is a compound obtained by a dehydration condensation reaction between a multifunctional carboxylic acid and an amine having a thiol group. Among them, a compound obtained by a dehydration condensation reaction between a multifunctional carboxylic acid having from 2 to 10 functional groups and an amine having one or more thiol groups is preferred.

Specific examples of the multifunctional carboxylic acid include the multifunctional carboxylic acids described above. Specific examples of the amine having one or more thiol groups include 2-aminoethanethiol, 2-aminothiophenol, 3-aminothiophenol and 4-aminothiophenol, and 2-aminoethanethiol and 4-aminothiophenol are preferred, and 2-aminoethanethiol is more preferred.

Specific examples of Compound F include compounds set forth below, but the invention should not be construed as being limited thereto.

TABLE 6

| | Amine Having Thiol Group | | | |
| --- | --- | --- | --- | --- |
| Multifunctional Carboxylic Acid | 2-Amino-etyhanetiol | 2-Amino-thiophenol | 3-Amino-thiophenol | 4-Amino-thiophenol |
| Tricarballylic acid (3) | SF-1 | SF-2 | SF-3 | SF-4 |
| 1,2,3,4-Butanetetracarboxylic acid (4) | SF-5 | SF-6 | SF-7 | SF-8 |
| Aconitic acid (3) | SF-9 | SF-10 | SF-11 | SF-12 |
| Citric acid (3) | SF-13 | SF-14 | SF-15 | SF-16 |
| Tetrahydrofuran-2,3,4,5-tetracarboxylic acid (4) | SF-17 | SF-18 | SF-19 | SF-20 |
| Mercaptosuccinic acid (2) | SF-21 | SF-22 | SF-23 | SF-24 |
| 2,2',2'',2'''-[1,2-Ethanediylidenetetra-kis(thio)]tetrakisacetic acid (4) | SF-25 | SF-26 | SF-27 | SF-28 |
| 1,3,5-Cyclohexanetricarboxylic acid (3) | SF-29 | SF-30 | SF-31 | SF-32 |
| 1,2,3,4-Cyclobutanetetracarboxylic acid (4) | SF-33 | SF-34 | SF-35 | SF-36 |
| 1,2,3,4,5,6-Cyclohexanehexacarboxylic acid (6) | SF-37 | SF-38 | SF-39 | SF-40 |
| 1,2,3-Benzenetricarboxylic acid (3) | SF-41 | SF-42 | SF-43 | SF-44 |
| 1,2,4-Benzenetricarboxylic acid (3) | SF-45 | SF-46 | SF-47 | SF-48 |
| 1,3,5-Benzenetricarboxylic acid (3) | SF-49 | SF-50 | SF-51 | SF-52 |
| 1,2,4,5-Benzenetetracarboxylic acid (4) | SF-53 | SF-54 | SF-55 | SF-56 |
| Mellitic acid (6) | SF-57 | SF-58 | SF-59 | SF-60 |
| 1,4,5,8-Naphthalenetetracarboxylic acid (4) | SF-61 | SF-62 | SF-53 | SF-64 |

Of the compounds shown in Table 6, SF-1, SF-4, SF-5, SF-8, SF-9, SF-13, SF-17, SF-20, SF-21, SF-24, SF-25, SF-28, SF-29, SF-32, SF-33, SF-36, SF-37, SF-40, SF-41, SF-45, SF-49, SF-52, SF-53, SF-56, SF-57, SF-60, SF-61 and SF-64 are preferred, and SF-1, SF-5, SF-17, SF-21, SF-25, SF-29, SF-33, SF-37, SF-49, SF-53, SF-57 and SF-61 are more preferred.

Since the multifunctional thiols described above have a long distance between the thiol groups and a small steric hindrance, the desired star structure can be formed.

Of the multifunctional thiols described above, Compounds A to E are preferred, Compounds A, B, C and E are more preferred, and Compounds A, B and C are particularly preferred, from the standpoint of the printing durability and development property.

[Polymer Chain]

The star polymer for use in the invention is a polymer having the multifunctional thiol as described above as the central skeleton and a polymer chain connected to the central skeleton via a sulfide bond, wherein the polymer chain contains an acid group and a crosslinkable group in its side chain.

The polymer chain of the star polymer includes a polymer chain of a known vinyl-based polymer, (meth)acrylic acid-based polymer or styrene-based polymer, which can be produced by radical polymerization, and a polymer chain of a (meth)acrylic acid-based polymer is particularly preferred.

One preferred example of the polymer chain for use in the invention is a copolymer containing a repeating unit having an acid group. Examples of the acid group include a carboxylic acid group, a phosphoric acid group, a phosphoric acid group, a phenolic hydroxy group, a sulfonamido group and a sulfonimido group. Of the acid groups, a carboxylic acid group, a phenolic hydroxy group, a sulfonamido group or a sulfonimido group is preferred, a carboxylic acid group, a sulfonamido group or a sulfonimido group is more preferred, and a carboxylic acid group is particularly preferred.

As the repeating unit having an acid group, a repeating unit derived from (meth)acrylic acid or a repeating unit represented by formula (I) shown below is preferably used.

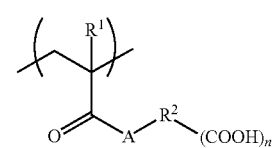

(I)

In formula (I), $R^1$ represents a hydrogen atom or a methyl group, $R^2$ represents a single bond or an n+1 valent connecting group, A represents an oxygen atom or —$NR^3$—, wherein $R^3$ represents a hydrogen atom or a monovalent hydrocarbon group having from 1 to 10 carbon atoms, and n represents an integer of 1 to 5.

The connecting group represented by $R^2$ in formula (I) is constructed from a hydrogen atom, a carbon atom, an oxygen atom, a nitrogen atom, a sulfur atom and a halogen atom and preferably contains from 1 to 80 atoms. Specific examples of the connecting group include an alkylene group, a substituted alkylene group, an arylene group and a substituted arylene group. The connecting group may have a structure wherein a plurality of such divalent groups is connected to each other via an amido bond, an ether bond, a urethane bond, a urea bond or an ester bond. $R^2$ is preferably a single bond, an alkylene group, a substituted alkylene group or a structure wherein a plurality of alkylene group and/or substituted alkylene group is connected to each other via an amido bond, an ether bond, a urethane bond, a urea bond or an ester bond, particularly preferably a single bond, an alkylene group having from 1 to 5 carbon atoms, a substituted alkylene group having from 1 to 5 carbon atoms or a structure wherein a plurality of alkylene group having from 1 to 5 carbon atoms and/or substituted alkylene group having from 1 to 5 carbon atoms is connected to each other via an amido bond, an ether bond, a urethane bond, a urea bond or an ester bond, and most preferably a single bond, an alkylene group having from 1 to 3 carbon atoms, a substituted alkylene group having from 1 to 3 carbon atoms or a structure wherein a plurality of alkylene group having from 1 to 3 carbon atoms and/or substituted alkylene group having from 1 to 3 carbon atoms is connected to each other via an amido bond, an ether bond, a urethane bond, a urea bond or an ester bond.

Examples of the substituent include a monovalent non-metallic atomic group exclusive of a hydrogen atom, for example, a halogen atom (e.g., —F, —Br, —Cl or —I), a hydroxy group, a cyano group, an alkoxy group, an aryloxy group, a mercapto group, an alkylthio group, an arylthio group, an alkylcarbonyl group, an arylcarbonyl group, a carboxyl group and a conjugate base group thereof, an alkoxycarbonyl group, an aryloxycarbonyl group, a carbamoyl group, an aryl group, an alkenyl group and an alkynyl group.

$R^3$ is preferably a hydrogen atom or a hydrocarbon group having from 1 to 5 carbon atoms, particularly preferably a hydrogen atom or a hydrocarbon group having from 1 to 3 carbon atoms, and most preferably a hydrogen atom or a methyl group. n is preferably from 1 to 3, particularly preferably 1 or 2, and most preferably 1.

A ratio of the copolymerization component having an acid group in the total copolymerization component of the polymer chain for use in the invention is preferably from 1 to 70% by mole in view of the development property. Considering good compatibility between the development property and printing durability, it is more preferably from 1 to 50% by mole, and particularly preferably from 1 to 30% by mole.

Specific examples of the repeating unit having an acid group are set forth below.

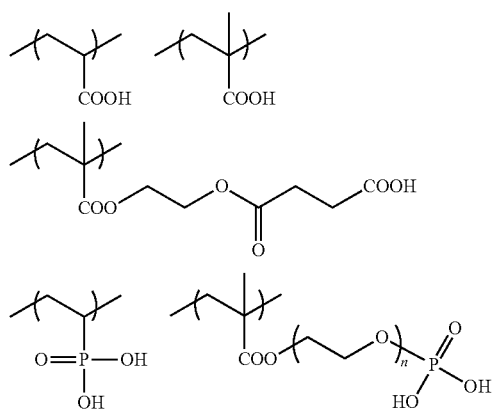

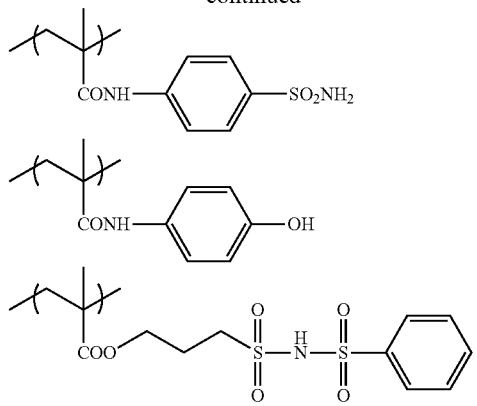

The polymer chain for use in the invention further contains a crosslinkable group. The crosslinkable group as used herein means a group capable of crosslinking the polymer chain in the process of a radical polymerization reaction which is caused in the image-recording layer, when the lithographic printing plate precursor is exposed to light. The crosslinkable group is not particularly restricted as long as it has such a function and includes, for example, an ethylenically unsaturated bond group, an amino group or an epoxy group as a functional group capable of undergoing an addition polymerization reaction. Also, a functional group capable of forming a radical upon irradiation with light may be used and such a crosslinkable functional group includes, for example, a thiol group and a halogen atom. Among them, the ethylenically unsaturated bond group is preferred. As the ethylenically unsaturated bond group, for example, a styryl group, a (meth)acryloyl group, an allyl group and a vinyl group are exemplified.

In the polymer chain according to the invention, for example, a free radical (a polymerization initiating radical or a propagating radical in the process of polymerization of the polymerizable compound) is added to the crosslinkable functional group to cause an addition-polymerization between the polymer chains directly or through a polymerization chain of the polymerizable compound, as a result, crosslinkage is formed between the polymer chains to effect curing. Alternatively, an atom (for example, a hydrogen atom on the carbon atom adjacent to the crosslinkable functional group) in the polymer chain is withdrawn by a free radical to produce a polymer radical and the polymer radicals combine with each other to form crosslinkage between the polymer chains to effect curing.

The content of the crosslinkable group (content of the radical polymerizable unsaturated double bond determined by iodine titration) in the polymer chain for use in the invention is preferably from 0.01 to 10.0 mmol, more preferably from 0.05 to 9.0 mmol, most preferably from 0.1 to 8.0 mmol, based on 1 g of the star polymer.

The polymer chain for use in the invention may contain a polymerization unit of an alkyl or aryl ester of (meth)acrylic acid, a polymerization unit of a (meth)acrylamide or a derivative thereof, a polymerization unit of an α-hydroxymethylacrylate or a polymerization unit of a styrene derivative in addition to the polymerization unit having an acid group and the polymerization unit having a crosslinkable group described above.

The alkyl group of the alkyl ester of (meth)acrylic acid is preferably an alkyl group having from 1 to 5 carbon atoms or an alkyl group having from 2 to 8 carbon atoms and the substituent described above, and more preferably a methyl group. The aralkyl ester of (meth)acrylic acid includes, for example, benzyl(meth)acrylate.

The (meth)acrylamide derivative includes, for example, N-isopropylacrylamide, N-phenylmethacrylamide, N-(4-methoxycarbonylphenyl)methacrylamide, N,N-dimethylacrylamide and morpholinoacrylamide.

The α-hydroxymethylacrylate includes, for example, ethyl α-hydroxymethylacrylate and cyclohexyl α-hydroxymethylacrylate. The styrene derivative includes, for example, styrene and 4-tert-butylstyrene.

Specific examples of the star polymer for use in the invention are set forth below, but the invention should not be construed as being limited thereto.

TABLE 7-continued
| Polymer No. | Central Skeleton No. | % by Mole[*1] | Repeating unit Having Acid Group | % by Mole | Repeating unit Having Crosslinkable Group | % by Mole | Other Repeating Unit | % by Mole | Mw (×10⁴) |
|---|---|---|---|---|---|---|---|---|---|
| P-10 | SB-93 | 0.5 | 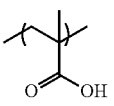 | 10 | 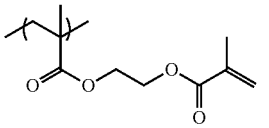 | 60 | 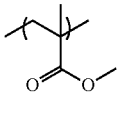 | 30 | 4.9 |
| P-11 | SB-94 | 0.5 | 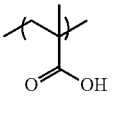 | 10 | 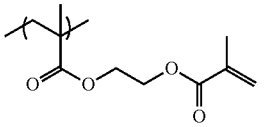 | 60 | 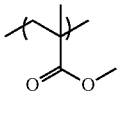 | 30 | 4.6 |
| P-12 | SB-99 | 0.5 | 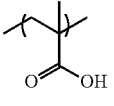 | 10 | 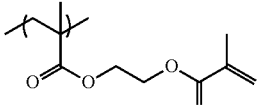 | 60 | 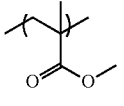 | 30 | 6.3 |
| P-13 | SB-100 | 0.5 | 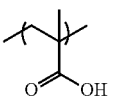 | 10 | 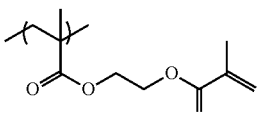 | 60 | 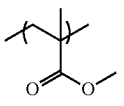 | 30 | 6.5 |
| P-14 | SB-101 | 0.5 | 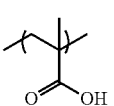 | 10 | 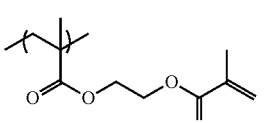 | 60 | 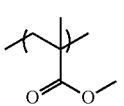 | 30 | 6.1 |
| P-15 | SC-2 | 0.4 | 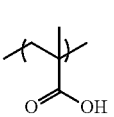 | 10 | 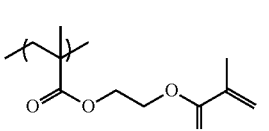 | 50 | 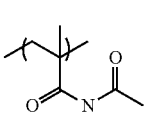 | 40 | 6.1 |
| P-16 | SC-37 | 0.4 | 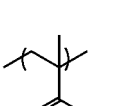 | 10 | 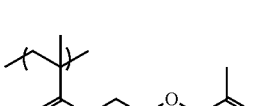 | 50 | 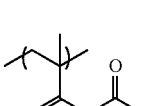 | 40 | 6.2 |
| P-17 | SC-44 | 0.4 | 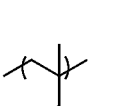 | 10 | 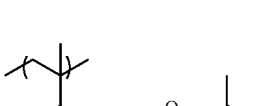 | 50 | 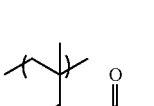 | 40 | 8.1 |
| P-18 | SC-86 | 0.4 | 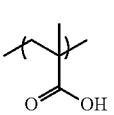 | 10 | 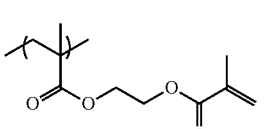 | 50 | 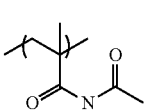 | 40 | 6.0 |
[*1] A ratio of mole number (%) of SH group to the total mole number of the monomers.

TABLE 8

| Polymer No. | Central Skeleton No. | % by Mole*1 | Repeating unit Having Acid Group | % by Mole | Repeating unit Having Crosslinkable Group | % by Mole | Other Repeating Unit | % by Mole | Mw (×10⁴) |
|---|---|---|---|---|---|---|---|---|---|
| P-19 | SC-93 | 0.4 | –[CH₂–C(CH₃)]– COOH | 10 | –[CH₂–C(CH₃)]–C(=O)–O–CH₂CH₂–O–C(=O)–C(CH₃)=CH₂ | 50 | –[CH₂–C(CH₃)]–C(=O)–NH–C(=O)–CH₃ | 40 | 10.8 |
| P-20 | SC-100 | 0.4 | –[CH₂–C(CH₃)]– COOH | 10 | –[CH₂–C(CH₃)]–C(=O)–O–CH₂CH₂–O–C(=O)–C(CH₃)=CH₂ | 50 | –[CH₂–C(CH₃)]–C(=O)–NH–C(=O)–CH₃ | 40 | 12.1 |
| P-21 | SA-4 | 0.5 | –[CH₂–CH]–C(=O)–O–CH₂CH₂–(3-Cl-4-OH-C₆H₃) | 20 | –[CH₂–C(CH₃)]–C(=O)–O–CH₂CH₂–O–C(=O)–C(CH₃)=CH₂ | 50 | –[CH₂–CH]–C(=O)–NH₂ | 30 | 5.2 |
| P-22 | SA-4 | 0.5 | –[CH₂–CH]–C(=O)–NH–C₆H₄–SO₂NH₂ | 20 | –[CH₂–C(CH₃)]–C(=O)–O–CH₂CH₂–O–C(=O)–C(CH₃)=CH₂ | 50 | –[CH₂–CH]–C(=O)–NH₂ | 30 | 4.9 |
| P-23 | SA-4 | 0.5 | –[CH₂–CH]–C(=O)–NH–SO₂–C₆H₄–CH₃ | 10 | –[CH₂–C(CH₃)]–C(=O)–O–CH₂CH₂–O–C(=O)–C(CH₃)=CH₂ | 50 | –[CH₂–CH]–C(=O)–NH₂ | 40 | 5.1 |
| P-28 | SB-205 | 0.5 | –[CH₂–C(CH₃)]–COOH | 17 | –[CH₂–C(CH₃)]–C(=O)–O–CH₂–CH(OH)–CH₂–O–CH₂–CH=CH₂ | 83 | | | 9.8 |
| P-29 | SB-2 | 0.5 | –[CH₂–C(CH₃)]–COOH | 17 | –[CH₂–C(CH₃)]–C(=O)–O–CH₂–CH(OH)–CH₂–O–CH₂–CH=CH₂ | 83 | | | 5.0 |
| P-30 | SB-9 | 0.5 | –[CH₂–C(CH₃)]–COOH | 17 | –[CH₂–C(CH₃)]–C(=O)–O–CH₂–CH(OH)–CH₂–O–CH₂–CH=CH₂ | 83 | | | 4.8 |
| P-31 | SB-30 | 0.5 | –[CH₂–C(CH₃)]–COOH | 17 | –[CH₂–C(CH₃)]–C(=O)–O–CH₂–CH(OH)–CH₂–O–CH₂–CH=CH₂ | 83 | | | 4.8 |
| P-32 | SB-37 | 0.5 | –[CH₂–C(CH₃)]–COOH | 17 | –[CH₂–C(CH₃)]–C(=O)–O–CH₂–CH(OH)–CH₂–O–CH₂–CH=CH₂ | 83 | | | 5.1 |

TABLE 8-continued

| Polymer No. | Central Skeleton No. | % by Mole*1 | Repeating unit Having Acid Group | % by Mole | Repeating unit Having Crosslinkable Group | % by Mole | Other Repeating Unit | % by Mole | Mw (×10⁴) |
|---|---|---|---|---|---|---|---|---|---|
| P-33 | SB-65 | 0.5 | -CH2-C(CH3)(COOH)- | 17 | -CH2-C(CH3)(COO-CH2-CH(OH)-CH2-O-CH2-CH=CH2)- | 83 | | | 4.7 |
| P-34 | SB-79 | 0.5 | -CH2-C(CH3)(COOH)- | 17 | -CH2-C(CH3)(COO-CH2-CH(OH)-CH2-O-CH2-CH=CH2)- | 83 | | | 5.1 |
| P-35 | SB-93 | 0.5 | -CH2-C(CH3)(COOH)- | 17 | -CH2-C(CH3)(COO-CH2-CH(OH)-CH2-O-CH2-CH=CH2)- | 83 | | | 5.1 |
| P-36 | SB-100 | 0.5 | -CH2-C(CH3)(COOH)- | 17 | -CH2-C(CH3)(COO-CH2-CH(OH)-CH2-O-CH2-CH=CH2)- | 83 | | | 6.5 |
| P-37 | SB-156 | 0.5 | -CH2-C(CH3)(COOH)- | 17 | -CH2-C(CH3)(COO-CH2-CH(OH)-CH2-O-CH2-CH=CH2)- | 83 | | | 10.1 |
| P-38 | SB-170 | 0.5 | -CH2-C(CH3)(COOH)- | 17 | -CH2-C(CH3)(COO-CH2-CH(OH)-CH2-O-CH2-CH=CH2)- | 83 | | | 9.9 |
| P-39 | SB-212 | 0.5 | -CH2-C(CH3)(COOH)- | 17 | -CH2-C(CH3)(COO-CH2-CH(OH)-CH2-O-CH2-CH=CH2)- | 83 | | | 12.9 |

TABLE 9

| Polymer No. | Central Skeleton No. | % by Mole*1 | Repeating unit Having Acid Group | % by Mole | Repeating unit Having Crosslinkable Group | % by Mole | Other Repeating Unit | % by Mole | Mw (×10⁴) |
|---|---|---|---|---|---|---|---|---|---|
| P-40 | SE-14 | 1 | -CH2-C(CH3)(COO-CH2CH2-O-CO-CH2CH2-COOH)- | 18 | -CH2-C(CH3)(COO-CH2CH2-O-CO-C(CH3)=CH2)- | 60 | -CH2-C(CH3)(CO-NH-C6H4-COOMe)- | 22 | 4.1 |
| P-41 | SE-20 | 1 | -CH2-C(CH3)(COO-CH2CH2-O-CO-CH2CH2-COOH)- | 18 | -CH2-C(CH3)(COO-CH2CH2-O-CO-C(CH3)=CH2)- | 60 | -CH2-C(CH3)(CO-NH-C6H4-COOMe)- | 22 | 4.3 |

TABLE 9-continued

| Polymer No. | Central Skeleton No. | % by Mole*1 | Repeating unit Having Acid Group | % by Mole | Repeating unit Having Crosslinkable Group | % by Mole | Other Repeating Unit | % by Mole | Mw (×10⁴) |
|---|---|---|---|---|---|---|---|---|---|
| P-42 | SE-43 | 1 | (structure with COOH) | 18 | (methacrylate structure) | 60 | (aryl amide COOMe) | 22 | 5.3 |
| P-43 | SE-51 | 1 | (structure with COOH) | 18 | (methacrylate structure) | 60 | (aryl amide COOMe) | 22 | 5.3 |
| P-44 | SE-57 | 1 | (structure with COOH) | 18 | (methacrylate structure) | 60 | (aryl amide COOMe) | 22 | 4.0 |
| P-45 | SE-63 | 1 | (structure with COOH) | 18 | (methacrylate structure) | 60 | (aryl amide COOMe) | 22 | 5.2 |
| P-46 | SE-69 | 1 | (structure with COOH) | 18 | (methacrylate structure) | 60 | (aryl amide COOMe) | 22 | 8.0 |
| P-47 | SE-85 | 1 | (structure with COOH) | 18 | (methacrylate structure) | 60 | (aryl amide COOMe) | 22 | 4.4 |
| P-48 | SE-97 | 1 | (structure with COOH) | 18 | (methacrylate structure) | 60 | (aryl amide COOMe) | 22 | 4.1 |
| P-49 | SE-103 | 1 | (structure with COOH) | 18 | (methacrylate structure) | 60 | (aryl amide COOMe) | 22 | 5.3 |
| P-50 | SE-109 | 1 | (structure with COOH) | 18 | (methacrylate structure) | 60 | (aryl amide COOMe) | 22 | 8.1 |
| P-51 | SE-115 | 1 | (structure with COOH) | 18 | (methacrylate structure) | 60 | (aryl amide COOMe) | 22 | 5.3 |

TABLE 9-continued

| Polymer No. | Central Skeleton No. | % by Mole*1 | Polymer Chain Repeating unit Having Acid Group | % by Mole | Repeating unit Having Crosslinkable Group | % by Mole | Other Repeating Unit | % by Mole | Mw (×10⁴) |
|---|---|---|---|---|---|---|---|---|---|
| P-52 | SE-55 | 1 | [structure with COOH] | 18 | [structure with methacrylate] | 60 | [structure with COOMe] | 22 | 4.1 |
| P-53 | SE-56 | 1 | [structure with COOH] | 18 | [structure with methacrylate] | 60 | [structure with COOMe] | 22 | 4.5 |
| P-54 | SE-58 | 1 | [structure with COOH] | 18 | [structure with methacrylate] | 60 | [structure with COOMe] | 22 | 4.6 |
| P-55 | SE-59 | 1 | [structure with COOH] | 18 | [structure with methacrylate] | 60 | [structure with COOMe] | 22 | 8.5 |

The star polymer according to the invention can be synthesized by a method of radical polymerization using a multifunctional thiol.

The weight average molecular weight (Mw) of the star polymer according to the invention is preferably from 5,000 to 500,000, more preferably from 10,000 to 250,000, and particularly preferably from 20,000 to 150,000. In the range described above, the development property and printing durability are improved.

The star polymers according to the invention may be used only one kind or two or more kinds in combination. Also, it can be used together with a conventional straight-chain type polymer.

The content of the star polymer according to the invention in the image-recording layer is preferably from 5 to 95% by weight, more preferably from 10 to 90% by weight, particularly preferably from 15 to 85% by weight, based on the total solid content of the image-recording layer.

[Image-Recording Layer]

The image-recording layer for use in the lithographic printing plate precursor according to the invention contains (B) a radical polymerization initiator and (C) a radical polymerizable compound in addition to (A) the star polymer described above, and may contain (D) other optional components.

(B) Polymerization Initiator

The image-recording layer contains a polymerization initiator (hereinafter, also referred to as an initiator compound). In the invention, a radical polymerization initiator is preferably used.

As the initiator compound in the invention, initiator compounds known to those skilled in the art can be used without limitation. Specifically, the initiator compound includes, for example, a trihalomethyl compound, a carbonyl compound, an organic peroxide, an azo compound, an azide compound, a metallocene compound, a hexaarylbiimidazole compound, an organic boron compound, a disulfone compound, an oxime ester compound, an onium salt compound and a iron arene complex. Among them, at least one compound selected from the hexaarylbiimidazole compound, onium salt compound, trihalomethyl compound and metallocene compound is preferred, and the hexaarylbiimidazole compound or the onium salt compound is particularly preferred. Two or more kinds of the polymerization initiators may be appropriately used in combination.

The hexaarylbiimidazole compound includes, for example, lophine dimers described in European Patents 24,629 and 107,792 and U.S. Pat. No. 4,410,621, specifically, 2,2'-bis(o-chlorophenyl)-4,4',5,5'-tetraphenylbiimidazole, 2,2'-bis(o-bromophenyl)-4,4',5,5'-tetraphenylbiimidazole, 2,2'-bis(o,p-dichlorophenyl)-4,4',5,5'-tetraphenylbiimidazole,
2,2'-bis(o-chlorophenyl)-4,4',5,5'-tetra(m-methoxyphenyl) biimidazole,
2,2'-bis(o,o'-dichlorophenyl)-4,4',5,5'-tetraphenylbiimidazole,
2,2'-bis(o-nitrophenyl)-4,4',5,5'-tetraphenylbiimidazole,
2,2'-bis(o-methylphenyl)-4,4',5,5'-tetraphenylbiimidazole and
2,2'-bis(o-trifluoromethylphenyl)-4,4',5,5'-tetraphenylbiimidazole.

The hexaarylbiimidazole compound is particularly preferably used together with a sensitizing dye having an absorption maximum in a wavelength range from 300 to 450 nm.

The onium salt compound preferably used in the invention includes a sulfonium salt, an iodonium salt and a diazonium salt. Particularly, a diaryliodonium salt or a triarylsulfonium salt is preferably used. The onium salt compound is particularly preferably used together with an infrared absorbing agent having an absorption maximum in a wavelength range from 750 to 1,400 nm.

In addition, polymerization initiators described in Paragraph Nos. [0071] to [0129] of JP-A-2007-206217 are preferably used.

The polymerization initiators are preferably used individually or in combination of two or more thereof according to the invention.

The amount of the polymerization initiator used in the image-recording layer according to the invention is preferably from 0.01 to 20% by weight, more preferably from 0.1 to 15% by weight, still more preferably from 1.0 to 10% by weight, based on the total solid content of the image-recording layer.

(C) Polymerizable Compound

The polymerizable compound for use in the image-recording layer according to the invention is an addition-polymerizable compound having at least one ethylenically unsaturated double bond and it is selected from compounds having at least one, preferably two or more, terminal ethylenically unsaturated double bonds. The polymerizable compound has a chemical form, for example, a monomer, a prepolymer, specifically, a dimer, a trimer or an oligomer, or a mixture thereof. Examples of the monomer include unsaturated carboxylic acids (for example, acrylic acid, methacrylic acid, itaconic acid, crotonic acid, isocrotonic acid or maleic acid) and esters or amides thereof. Preferably, esters of an unsaturated carboxylic acid with a polyhydric alcohol compound and amides of an unsaturated carboxylic acid with a polyvalent amine compound are used. An addition reaction product of an unsaturated carboxylic acid ester or amide having a nucleophilic substituent, for example, a hydroxy group, an amino group or a mercapto group, with a monofunctional or polyfunctional isocyanate or epoxy compound, or a dehydration condensation reaction product of the unsaturated carboxylic acid ester or amide with a monofunctional or polyfunctional carboxylic acid is also preferably used. Moreover, an addition reaction product of an unsaturated carboxylic acid ester or amide having an electrophilic substituent, for example, an isocyanate group or an epoxy group, with a monofunctional or polyfunctional alcohol, amine or thiol, or a substitution reaction product of an unsaturated carboxylic acid ester or amide having a releasable substituent, for example, a halogen atom or a tosyloxy group with a monofunctional or polyfunctional alcohol, amine or thiol is also preferably used. In addition, compounds in which the unsaturated carboxylic acid described above is replaced by an unsaturated phosphonic acid, styrene, vinyl ether or the like can also be used. These compounds are described in references including JP-T-2006-508380 (the term "JP-T" as used herein means a published Japanese translation of a PCT patent application), JP-A-2002-287344, JP-A-2008-256850, JP-A-2001-342222, JP-A-9-179296, JP-A-9-179297, JP-A-9-179298, JP-A-2004-294935, JP-A-2006-243493, JP-A-2002-275129, JP-A-2003-64130, JP-A-2003-280187 and JP-A-10-333321.

Specific examples of the monomer, which is an ester of a polyhydric alcohol compound with an unsaturated carboxylic acid, include, as an acrylic acid ester, for example, ethylene glycol diacrylate, 1,3-butanediol diacrylate, tetramethylene glycol diacrylate, propylene glycol diacrylate, trimethylolpropane triacrylate, hexanediol diacrylate, tetraethylene glycol diacrylate, pentaerythritol tetraacrylate, sorbitol triacrylate, isocyanuric acid ethylene oxide (EO) modified triacrylate and polyester acrylate oligomer. As a methacrylic acid ester, for example, tetramethylene glycol dimethacrylate, neopentyl glycol dimethacrylate, trimethylolpropane trimethacrylate, ethylene glycol dimethacrylate, pentaerythritol trimethacrylate, bis[p-(3-methacryloxy-2-hydroxypropoxy)phenyl]dimethylmethane and bis[p-(methacryloxyethoxy)phenyl]dimethylmethane are exemplified. Specific examples of the monomer, which is an amide of a polyvalent amine compound with an unsaturated carboxylic acid, include methylene bisacrylamide, methylene bismethacrylamide, 1,6-hexamethylene bisacrylamide, 1,6-hexamethylene bismethacrylamide, diethylenetriamine trisacrylamide, xylylene bisacrylamide and xylylene bismethacrylamide.

Urethane type addition-polymerizable compounds produced using an addition reaction between an isocyanate and a hydroxy group are also preferably used and specific examples thereof include vinylurethane compounds having two or more polymerizable vinyl groups per molecule obtained by adding a vinyl monomer containing a hydroxy group represented by formula (A) shown below to a polyisocyanate compound having two or more isocyanate groups per molecule, described in JP-B-48-41708 (the term "JP-B" as used herein means an "examined Japanese patent publication").

$$CH_2=C(R^4)COOCH_2CH(R^5)OH \quad (A)$$

wherein $R^4$ and $R^5$ each independently represents H or $CH_3$.

Also, urethane acrylates as described in JP-A-51-37193, JP-B-2-32293, JP-B-2-16765, JP-A-2003-344997 and JP-A-2006-65210, urethane compounds having an ethylene oxide skeleton described in JP-B-58-49860, JP-B-56-17654, JP-B-62-39417, JP-B-62-39418, JP-A-2000-250211 and JP-A-2007-94138, and urethane compounds having a hydrophilic group described in U.S. Pat. No. 7,153,632, JP-T-8-505958, JP-A-2007-293221 and JP-A-2007-293223 are preferably used.

Details of the method of using the polymerizable compound, for example, selection of the structure, individual or combination use or an amount added, can be appropriately determined in accordance with the characteristic design of the final lithographic printing plate precursor. The polymerizable compound is used preferably in a range from 5 to 75% by weight, more preferably in a range from 25 to 70% by weight, particularly preferably in a range from 30 to 60% by weight, based on the total solid content of the image-recording layer.

(D) Sensitizing Dye

The image-recording layer according to the invention preferably contains a sensitizing dye. The sensitizing dye can be used without particular limitation as far as it absorbs light at the image exposure to form the excited state and provides energy to the polymerization initiator described above with electron transfer, energy transfer or heat generation thereby improving the polymerization initiation function. Particularly, a sensitizing dye having an absorption maximum in a wavelength range from 300 to 450 nm or from 750 to 1,400 nm is preferably used.

Examples of the sensitizing dye having an absorption maximum in a wavelength range from 300 to 450 nm include merocyanine dyes, benzopyranes, coumarins, aromatic ketones, anthracenes, styryls and oxazoles.

Of the sensitizing dyes having an absorption maximum in a wavelength range from 300 to 450 nm, a dye represented by formula (2) shown below is more preferable in view of high sensitivity.

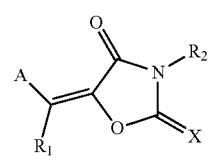

(2)

In formula (2), A represents an aryl group which may have a substituent or a heteroaryl group which may have a substituent, X represents an oxygen atom, a sulfur atom or $=N(R_3)$, and $R_1$, $R_2$ and $R_3$ each independently represents a monovalent non-metallic atomic group, or A and $R_1$ or $R_2$ and $R_3$ may be combined with each other to form an aliphatic or aromatic ring.

The formula (2) will be described in more detail below. $R_1$, $R_2$ and $R_3$ each independently represents a monovalent non-metallic atomic group, preferably a hydrogen atom, a substituted or unsubstituted alkyl group, a substituted or unsubstituted alkenyl group, a substituted or unsubstituted aryl group, a substituted or unsubstituted heteroaryl group, a substituted or unsubstituted alkoxy group, a substituted or unsubstituted alkylthio group, a hydroxy group or a halogen atom.

Specific examples of such a sensitizing dye preferably used include compounds described in Paragraph Nos. [0047] to [0053] of JP-A-2007-58170, Paragraph Nos. [0036] to [0037] of JP-A-2007-93866 and Paragraph Nos. [0042] to [0047] of JP-A-2007-72816.

Further, sensitizing dyes described in JP-A-2006-189604, JP-A-2007-171406, JP-A-2007-206216, JP-A-2007-206217, JP-A-2007-225701, JP-A-2007-225702, JP-A-2007-316582 and JP-A-2007-328243 are also preferably used.

The sensitizing dyes may be used only one kind or in combination of two or more kinds thereof.

Next, the sensitizing dye having an absorption maximum in a wavelength range from 750 to 1,400 (hereinafter, also referred to as an "infrared absorbing agent") preferably used in the invention is described in detail below. The infrared absorbing agent used is preferably a dye or a pigment.

As the dye, commercially available dyes and known dyes described in literatures, for example, *Senryo Binran (Dye Handbook)* compiled by The Society of Synthetic Organic Chemistry, Japan (1970) can be used. Specifically, the dyes includes azo dyes, metal complex azo dyes, pyrazolone azo dyes, naphthoquinone dyes, anthraquinone dyes, phthalocyanine dyes, carbonium dyes, quinoneimine dyes, methine dyes, cyanine dyes, squarylium dyes, pyrylium salts and metal thiolate complexes.

Of the dyes, cyanine dyes, squarylium dyes, pyrylium dyes, nickel thiolate complexes and indolenine cyanine dyes are particularly preferred. Further, cyanine dyes and indolenine cyanine dyes are more preferred. As particularly preferable examples of the dye, cyanine dyes represented by formula (a) shown below are exemplified.

Formula (a):

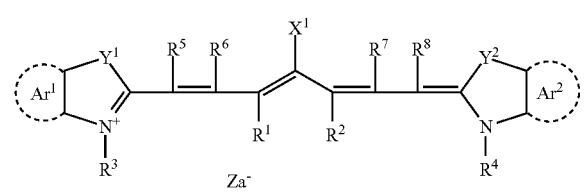

In formula (a), $X^1$ represents a hydrogen atom, a halogen atom, $-N(R^9)(R^{10})$, $-X^2-L^1$ or a group shown below. $R^9$ and $R^{10}$, which may be the same or different, each represents an aromatic hydrocarbon group having from 6 to 10 carbon atoms, which may have a substituent, an alkyl group having from 1 to 8 carbon atoms or a hydrogen atom or $R^9$ and $R^{10}$ may be combined with each other to from a ring, and preferably represents a phenyl group. $X^2$ represents an oxygen atom or a sulfur atom, $L^1$ represents a hydrocarbon group having from 1 to 12 carbon atoms, an aromatic cyclic group containing a hetero atom or a hydrocarbon group having from 1 to 12 carbon atoms and containing a hetero atom. The hetero atom as used herein means a nitrogen atom, a sulfur atom, an oxygen atom, a halogen atom or a selenium atom. In the group shown below, $Xa^-$ has the same meaning as $Za^-$ defined hereinafter. $R^a$ represents a hydrogen atom or a substituent selected from an alkyl group, an aryl group, a substituted or unsubstituted amino group and a halogen atom.

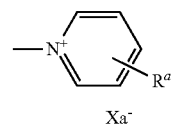

$R^1$ and $R^2$ each independently represents a hydrocarbon group having from 1 to 12 carbon atoms. In view of the preservation stability of a coating solution for image-recording layer, it is preferred that $R^1$ and $R^2$ each represents a hydrocarbon group having two or more carbon atoms. Also, $R^1$ and $R^2$ may be combined with each other to form a ring and in case of fowling the ring, to form a 5-membered or 6-membered ring is particularly preferred.

$Ar^1$ and $Ar^2$, which may be the same or different, each represents an aryl group which may have a substituent. Preferable examples of the aryl group include a benzene ring group and a naphthalene ring group. Preferable examples of the substituent include a hydrocarbon group having 12 or less carbon atoms, a halogen atom and an alkoxy group having 12 or less carbon atoms. $Y^1$ and $Y^2$, which may be the same or different, each represents a sulfur atom or a dialkylmethylene group having 12 or less carbon atoms. $R^3$ and $R^4$, which may be the same or different, each represents a hydrocarbon group having 20 or less carbon atoms, which may have a substituent. Preferable examples of the substituent include an alkoxy group having 12 or less carbon atoms, a carboxyl group and a sulfo group. $R^5$, $R^6$, $R^7$ and $R^8$, which may be the same or different, each represents a hydrogen atom or a hydrocarbon group having 12 or less carbon atoms. From the standpoint of the availability of raw materials, a hydrogen atom is preferred. $Za^-$ represents a counter anion. However, $Za^-$ is not necessary when the cyanine dye represented by formula (a) has an anionic substituent in the structure thereof and the neutralization of charge is not needed. Preferable examples of the counter ion for $Za^-$ include a halide ion, a perchlorate ion, a tetrafluoroborate ion, a hexafluorophosphate ion and a sulfonate ion, and particularly preferable examples thereof include a perchlorate ion, a hexafluorophosphate ion and an arylsulfonate ion in view of the preservation stability of a coating solution for image-recording layer.

Specific examples of the cyanine dye represented by formula (a) preferably used in the invention include compounds described in Paragraph Nos. [0017] to [0019] of JP-A-2001-133969, Paragraph Nos. [0012] to [0021] of JP-A-2002-23360 and Paragraph Nos. [0012] to [0037] of JP-A-2002-40638, preferably compounds described in Paragraph Nos. [0034] to [0041] of JP-A-2002-278057 and Paragraph Nos. [0080] to [0086] of JP-A-2008-195018, and particularly preferably compounds described in Paragraph Nos. [0035] to [0043] of JP-A-2007-90850.

Further, compounds described in Paragraph Nos. [0008] to [0009] of JP-A-5-5005 and Paragraph Nos. [0022] to [0025] of JP-A-2001-222101 are also preferably used.

The infrared absorbing dyes may be used only one kind or in combination of two or more kinds thereof and may be used together with an infrared absorbing agent other than the infrared absorbing dye, for example, a pigment. As the pigment, compounds described in Paragraph Nos. [0072] to [0076] of JP-A-2008-195018 are preferred.

The amount of the sensitizing dye added is preferably from 0.05 to 30% by weight, more preferably from 0.1 to 20% by weight, most preferably from 0.2 to 10% by weight, based on the total solid content of the image-recording layer.

(E) Other Components of Image-Recording Layer

Into the image-recording layer according to the invention, various additives can be further incorporated, if desired. Examples of the additive include a surfactant for progressing the development property and improving the surface state of coated layer, a microcapsule for providing good compatibility between the development property and printing durability, a hydrophilic polymer for improving the development property and dispersion stability of microcapsule, a coloring agent or print-out agent for visually distinguishing the image area from the non-image area, a polymerization inhibitor for preventing undesirable thermal polymerization of the radical polymerizable compound during the production or preservation of the image-recording layer, a hydrophobic low molecular weight compound, for example, a higher fatty acid derivative for avoiding polymerization inhibition due to oxygen, a fine inorganic particle for increasing strength of the cured layer in the image area, a fine organic particle, a hydrophilic low molecular weight compound for improving the development property, a co-sensitizer or chain transfer agent for increasing sensitivity, a plasticizer for improving plasticity, and an oil-sensitizing agent for improving ink receptivity. As the additives, known compounds are used and, for example, compounds described in Paragraph Nos. [0161] to [0215] of JP-A-2007-206217, Paragraph No. [0067] of JP-T-2005-509192, Paragraph Nos. [0023] to [0026] and [0059] to [0066] of JP-A-2004-310000 are used. With respect to the surfactant, surfactants which may be added to a developer described hereinafter may be used.

The image-recording layer preferably contains a chain transfer agent. The chain transfer agent is defined, for example, in *Kobunshi Jiten (Polymer Dictionary)*, Third Edition, pages 683 to 684, edited by The Society of Polymer Science, Japan (2005). As the chain transfer agent, for example, compounds having SH, PH, SiH or GeH in their molecules are used. The compound donates a hydrogen to a low active radical species to generate a radical or is oxidized and then deprotonized to generate a radical.

In the image-recording layer according to the invention, a thiol compound (for example, a 2-mercaptobenzimidazole, a 2-mercaptobenzothiazole, a 2-mercaptobenzoxazole, a 3-mercaptotriazole or a 5-mercaptotetrazole) is preferably used.

The content of the chain transfer agent is preferably from 0.01 to 20% by weight, more preferably from 1 to 10% by weight, most preferably from 1 to 5% by weight, per the total solid content of the image-recording layer.

In order to improve the ink receptivity, an oil-sensitizing agent, for example, a phosphonium compound, a nitrogen-containing low molecular weight compound or an ammonium group-containing polymer can be used in the image-recording layer according to the invention. In particular, in the case where an inorganic stratiform compound is incorporated into a protective layer, the oil-sensitizing agent functions as a surface covering agent of the inorganic stratiform compound and prevents deterioration of the ink receptivity during printing due to the inorganic stratiform compound.

Preferred examples of the compound include a phosphonium compound, an amine salt, a quaternary ammonium salt, an imidazolinium salt, a benzimidazolinium salt, a pyridinium salt, a quinolinium salt described in JP-A-2006-297907 and JP-A-2007-50660 and an ammonium group-containing polymer described in JP-A-2009-208458.

The content of the oil-sensitizing agent is preferably from 0.01 to 30.0% by weight, more preferably from 0.1 to 15.0% by weight, still more preferably from 1 to 10% by weight, based on the total solid content of the image-recording layer.

<Formation of Image-Recording Layer>

The image-recording layer according to the invention is formed by dispersing or dissolving each of the necessary components described above in a solvent to prepare a coating solution and coating the solution. The solvent used include, for example, methyl ethyl ketone, ethylene glycol monomethyl ether, 1-methoxy-2-propanol, 2-methoxyethyl acetate, 1-methoxy-2-propyl acetate and γ-butyrolactone, but the invention should not be construed as being limited thereto. The solvents may be used individually or as a mixture. The solid content concentration of the coating solution is preferably from 1 to 50% by weight.

The coating amount (solid content) of the image-recording layer on the support after the coating and drying is preferably from 0.3 to 3.0 $g/m^2$. Various methods can be used for the coating. Examples of the method include bar coater coating, spin coating, spray coating, curtain coating, dip coating, air knife coating, blade coating and roll coating.

[Protective Layer]

In the lithographic printing plate precursor according to the invention, a protective layer (oxygen-blocking layer) is preferably provided on the image-recording layer in order to prevent diffusion and penetration of oxygen which inhibits the polymerization reaction at the time of exposure. As a material for use in the protective layer, any water-soluble polymer and water-insoluble polymer can be appropriately selected to use. The polymers may be used in combination of two or more thereof, if desired. Specifically, for example, polyvinyl alcohol, a modified polyvinyl alcohol, polyvinyl pyrrolidone, a water-soluble cellulose derivative and poly(meth)acrylonitrile are exemplified. Among them, a water-soluble polymer compound relatively excellent in crystallizability is preferably used. Specifically, when polyvinyl alcohol is used as a main component, the particularly preferred results can be obtained in the fundamental characteristics, for example, oxygen-blocking property and removability by development.

Polyvinyl alcohol for use in the protective layer may be partially substituted with ester, ether or acetal as long as it contains unsubstituted vinyl alcohol units for achieving the necessary oxygen-blocking property and water solubility. Also, polyvinyl alcohol may partly have other copolymer component. Polyvinyl alcohol is obtained by hydrolysis of polyvinyl acetate. Examples of the polyvinyl alcohol include those having a hydrolysis degree of 69.0 to 100% by mole and a polymerization repeating unit number of 300 to 2,400. Specific examples thereof include PVA-102, PVA-103, PVA-105, PVA-110, PVA-117, PVA-117H, PVA-120, PVA-124, PVA-124H, PVA-CS, PVA-CST, PVA-HC, PVA-203, PVA-204, PVA-205, PVA-210, PVA-217, PVA-220, PVA-224, PVA-235, PVA-217EE, PVA-217E, PVA-220E, PVA-224E, PVA-403, PVA-405, PVA-420, PVA-424H, PVA-505, PVA-617, PVA-613, PVA-706 and L-8 (produced by Kuraray Co., Ltd.). The polyvinyl alcohols can be used individually or as a mixture. According to a preferred embodiment, the content of polyvinyl alcohol in the protective layer is from 20 to 95% by weight, and more preferably from 30 to 90% by weight.

Also, known modified polyvinyl alcohol can be preferably used. Particularly, an acid-modified polyvinyl alcohol having a carboxylic acid group or a sulfonic acid group is preferably used. Specifically, modified polyvinyl alcohols described in JP-A-2005-250216 and JP-A-2006-259137 are preferably exemplified.

When the polyvinyl alcohol is used as a mixture with other material, as the other material mixed, a modified polyvinyl alcohol, polyvinyl pyrrolidone or a modified product thereof is preferred from the viewpoint of the oxygen-blocking property and removability by development. The content thereof in the protective layer is preferably from 3.5 to 80% by weight, more preferably from 10 to 60% by weight, and further more preferably from 15 to 30% by weight.

As other component of the protective layer, glycerin, dipropylene glycol or the like can be added in an amount corresponding to several % by weight of the material for the protective layer to provide flexibility. Further, an anionic surfactant, for example, sodium alkylsulfate or sodium alkylsulfonate, an amphoteric surfactant, for example, alkylaminocarboxylate and alkylaminodicarboxylate, or a nonionic surfactant, for example, polyoxyethylene alkyl phenyl ether can be added in an amount of several % by weight of the material for the protective layer.

Further, it is also preferred to incorporate an inorganic stratiform compound into the protective layer of the lithographic printing plate precursor according to the invention for the purpose of improving the oxygen-blocking property and property for protecting the surface of image-recording layer. Of the inorganic stratiform compounds, fluorine-based swellable synthetic mica, which is a synthetic inorganic stratiform compound, is particularly useful. Specifically, inorganic stratiform compounds described in JP-A-2005-119273 are preferably exemplified.

Further, protective layers described in U.S. Pat. No. 3,458,311, JP-B-55-49729, JP-A-2008-15503, JP-A-2008-89916 and Paragraph Nos. [0211] to [0261] of JP-2008-139813 are preferably used.

The coating amount of the protective layer is preferably in a range from 0.05 to 10 g/m² in terms of the coating amount after drying. When the protective layer contains the inorganic stratiform compound, it is more preferably in a range from 0.1 to 5 g/m², and when the protective layer does not contain the inorganic stratiform compound, it is more preferably in a range from 0.5 to 5 g/m².

[Support]

A support for use in the lithographic printing plate precursor according to the invention is not particularly restricted as long as it is a dimensionally stable plate-like hydrophilic support. Particularly, an aluminum plate is preferred. In advance of the use of an aluminum plate, the aluminum plate is preferably subjected to a surface treatment, for example, roughening treatment or anodizing treatment. The roughening treatment of the surface of the aluminum plate is conducted by various methods and includes, for example, mechanical roughening treatment, electrochemical roughening treatment (roughening treatment of electrochemically dissolving the surface) and chemical roughening treatment (roughening treatment of chemically dissolving the surface selectively). With respect to the surface treatments, methods described in Paragraph Nos. [0241] to of JP-2007-206217 are preferably used.

The center line average roughness of the support is preferably from 0.10 to 1.2 μm. In the range described above, good adhesion property to the image-recording layer and good printing durability and good resistance to stain are achieved.

The color density of the support is preferably from 0.15 to 0.65 in terms of the reflection density value. In the range described above, good image-forming property due to prevention of halation at the image exposure and good aptitude for plate inspection after development are achieved.

The thickness of the support is preferably from 0.1 to 0.6 mm, more preferably from 0.15 to 0.4 mm, and still more preferably from 0.2 to 0.3 mm.

<Hydrophilizing Treatment of Support and Undercoat Layer>

As for the lithographic printing plate precursor according to the invention, in order to increase hydrophilicity of the non-image area and to prevent printing stain, it is preferred after the anodizing treatment at least either to conduct hydrophilizing treatment for the surface of support or to provide an undercoat layer between the support and the image-recording layer.

The hydrophilizing treatment for the surface of support includes, for example, an alkali metal silicate treatment method wherein the support is subjected to an immersion treatment or an electrolytic treatment in an aqueous solution, for example, of sodium silicate, a method of treating with potassium fluorozirconate and a method of treating with polyvinylphosphonic acid. A method of immersion treatment in an aqueous polyvinylphosphonic acid solution is preferably used.

As the undercoat layer, an undercoat layer containing a compound having an acid group, for example, a phosphonic acid group, a phosphoric acid group or a sulfonic acid group is preferably used. The compound preferably further has a polymerizable group in order to increase the adhesion property to the image-recording layer. As the polymerizable group, an ethylenically unsaturated bond group is preferred. Further, a compound having a hydrophilicity-imparting group, for example, an ethylene oxide group is exemplified as a preferred compound.

These compounds may be low molecular weight compounds or polymer compounds. Also, these compounds may be used as a mixture of two or more thereof, if desired.

For example, a silane coupling agent having an addition-polymerizable ethylenically unsaturated bond group described in JP-A-10-282679 and a phosphorus compound having an ethylenically unsaturated bond group described in JP-A-2-304441 are preferably exemplified. Low molecular weight compounds or polymer compounds having a crosslinkable group (preferably an ethylenically unsaturated bond group), a functional group capable of interacting with the surface of support and a hydrophilic group described in JP-A-2005-238816, JP-A-2005-125749, JP-A-2006-239867 and JP-A-2006-215263 are also preferably used.

The undercoat layer can be coated by a known method. The coating amount (solid content) of the undercoat layer is preferably from 0.1 to 100 mg/m², and more preferably from 1 to 30 mg/m².

[Backcoat Layer]

A backcoat layer can be provided on the back surface of the support after conducting the surface treatment to the surface of support or forming the undercoat layer on the surface of support, if desired.

The backcoat layer preferably includes, for example, a coating layer comprising an organic polymer compound described in JP-A-5-45885 and a coating layer comprising a metal oxide obtained by hydrolysis and polycondensation of an organic metal compound or an inorganic metal compound described in JP-A-6-35174. Among them, use of an alkoxy compound of silicon, for example, $Si(OCH_3)_4$, $Si(OC_2H_5)_4$, $Si(OC_3H_7)_4$ or $Si(OC_4H_9)_4$ is preferred since the starting materials are inexpensive and easily available.

[Plate Making Method]

The plate making method of the lithographic printing plate precursor according to the invention is preferably a method including at least a step of imagewise exposing the lithographic printing plate precursor (hereinafter, also referred to as a "exposure step") and a step of development processing of the lithographic printing plate precursor with a processing solution (hereinafter, also referred to as a "development step").

<Exposure Step>

Although the lithographic printing plate precursor for use in the invention can be subjected to image recording by a method of scanning exposure of digital data by laser, for example, visible laser or infrared laser or a method of exposing through a transparent original having an image recorded using a light source, for example, a halogen lamp or a high pressure mercury lamp, the method of scanning exposure of digital data by laser, for example, visible laser or infrared laser is preferred.

The wavelength of the exposure light source is preferably from 300 to 450 nm or from 750 to 1,400 nm. In case of exposing with light of 300 to 450 nm, the lithographic printing plate precursor having an image-recording layer containing a sensitizing dye having an absorption maximum in such a wavelength range is used. In case of exposing with light of 750 to 1,400 nm, the lithographic printing plate precursor containing an infrared absorbing agent which is a sensitizing dye having an absorption maximum in such a wavelength range is used. As the light source of 300 to 450 nm, a semiconductor laser is preferably used. As the light source of 750 to 1,400 nm, a solid laser or semiconductor laser emitting an infrared ray is preferably used. The exposure mechanism may be any of an internal drum system, an external drum system and a flat bed system.

<Development Step>

After the exposure, the lithographic printing plate precursor for use in the invention is developed with water or an aqueous solution having pH from 2 to 14.

The processing with developer is ordinarily practiced according to the following steps: (1) removing the non-image area with a developer, (2) conducting gumming solution treatment and (3) drying in a drying step. Although the lithographic printing plate precursor for use in the invention can be developed according to the conventional steps described above (conventional development), it is preferred to conduct steps (1) and (2) simultaneously (simple development). In any of the development methods, a water washing step for removing a protective layer may be provided before step (1). The development of step (1) is conducted according to a conventional manner at temperature approximately from 0 to 60° C., preferably from 15 to 40° C., using, for example, a method wherein the imagewise exposed lithographic printing plate precursor is immersed in a developer and rubbed with a brush or a method wherein a developer is sprayed to the imagewise exposed lithographic printing plate precursor by a spray and the lithographic printing plate precursor is rubbed with a brush.

In case of the conventional development, a water washing step for removing an excess developer may be provided between step (1) and step (2). The developer used in step (1) is preferably a known alkali developer.

In case of the simple development, it is preferred that after the development and gumming treatment, an excess developer is removed using a squeeze roller and then drying is conducted.

The developer for use in the simple development is an aqueous solution having pH from 2 to 11. An aqueous solution containing water as the main component (containing 60% by weight or more of water) is preferred. In particular, an aqueous solution containing a surfactant (for example, an anionic, nonionic, cationic or amphoteric surfactant) or an aqueous solution containing a water-soluble polymer compound is preferred. An aqueous solution containing both the surfactant and the water-soluble polymer compound is also preferred. The pH of the developer is preferably from 5 to 10.7, more preferably from 6 to 10.5, and most preferably from 7.5 to 10.3.

The anionic surfactant for use in the developer for the simple development is not particularly limited and includes, for example, fatty acid salts, abietic acid salts, hydroxyalkanesulfonic acid salts, alkanesulfonic acid salts, dialkylsulfosuccinic acid salts, straight-chain alkylbenzenesulfonic acid salts, branched alkylbenzenesulfonic acid salts, alkylnaphthalenesulfonic acid salts, alkyldiphenylether (di)sulfonic acid salts, alkylphenoxy polyoxyethylene propylalkylsulfonic acid salts, polyoxyethylene alkylsulfophenyl ether salts, N-methylalkyl-N-oleyltaurine sodium salt, N-alkylsulfosuccinic acid monoamide disodium salts, petroleum sulfonic acid salts, sulfated castor oil, sulfated beef tallow oil, sulfate ester slats of fatty acid alkyl ester, alkyl sulfate ester salts, polyoxyethylene alkyl ether sulfate ester salts, fatty acid monoglyceride sulfate ester salts, polyoxyethylene alkyl phenyl ether sulfate ester salts, polyoxyethylene styryl phenyl ether sulfate ester salts, alkyl phosphate ester salts, polyoxyethylene alkyl ether phosphate ester salts, polyoxyethylene alkyl phenyl ether phosphate ester salts, partially saponified products of styrene-maleic anhydride copolymer, partially saponified products of olefin-maleic anhydride copolymer and naphthalene sulfonate formalin condensates. Of the compounds, alkylbenzenesulfonic acid salts, alkylnaphthalenesulfonic acid salts and alkyldiphenylether (di)sulfonic acid salts are particularly preferably used.

The cationic surfactant for use in the developer for the simple development is not particularly limited and conventionally known cationic surfactants can be used. Examples of the cationic surfactant include alkylamine salts, quaternary ammonium salts, alkylimidazolinium salts, polyoxyethylene alkyl amine salts and polyethylene polyamine derivatives.

The nonionic surfactant for use in the developer for the simple development is not particularly limited and includes, for example, polyethylene glycol type higher alcohol ethylene oxide adducts, alkylphenol ethylene oxide adducts, alkylnaphthol ethylene oxide adducts, phenol ethylene oxide adducts, naphthol ethylene oxide adducts, fatty acid ethylene oxide adducts, polyhydric alcohol fatty acid ester ethylene oxide adducts, higher alkylamine ethylene oxide adducts, fatty acid amide ethylene oxide adducts, ethylene oxide adducts of fat, polypropylene glycol ethylene oxide adducts, dimethylsiloxane-ethylene oxide block copolymers, dimethylsiloxane-(propylene oxide-ethylene oxide) block copolymers, fatty acid esters of polyhydric alcohol type glycerol, fatty acid esters of pentaerythritol, fatty acid esters of sorbitol and sorbitan, fatty acid esters of sucrose, alkyl ethers of polyhydric alcohols and fatty acid amides of alkanolamines. Of the compounds, those having an aromatic ring and an ethylene oxide chain are preferred and alkyl-substituted or unsubstituted phenol ethylene oxide adducts and alkyl-substituted or unsubstituted naphthol ethylene oxide adducts are more preferred.

The amphoteric surfactant for use in the developer for the simple development is not particularly limited and includes, for example, amine oxide type, for example, alkyldimethylamine oxide, betaine type, for example, alkyl betaine, and amino acid type, for example, sodium salt of alkylamino fatty acid. In particular, alkyldimethylamine oxide which may have a substituent, alkyl carboxy betaine which may have a substituent and alkyl sulfo betaine which may have a substituent are preferably used. Specific examples of the amphoteric surfactant include compounds described in Paragraph Nos. [0255] to [0278] and compounds represented by formula (2) in Paragraph No. [0256] of JP-A-2008-203359, compounds described in Paragraph Nos. [0028] to [0052] and compounds represented by formulae (I), (II) and (VI) in Paragraph No. [0028] of JP-A-2008-276166 and compounds described in Paragraph Nos. [0022] to [0029] of JP-A-2009-47927.

Two or more of the surfactants may be used in combination. The content of the surfactant in the developer is preferably from 0.01 to 20% by weight, and more preferably from 0.1 to 10% by weight.

The water-soluble polymer compound for use in the developer for the simple development includes, for example, soybean polysaccharide, modified starch, gum arabic, dextrin, a cellulose derivative (for example, carboxymethyl cellulose, carboxyethyl cellulose or methyl cellulose) or a modified product thereof, pllulan, polyvinyl alcohol or a derivative thereof, polyvinyl pyrrolidone, polyacrylamide, an acrylamide copolymer, a vinyl methyl ether/maleic anhydride copolymer, a vinyl acetate/maleic anhydride copolymer, a styrene/maleic anhydride copolymer, polyvinylsulfonic acid or a salt thereof and polystyrenesulfonic acid or a salt thereof.

As the soybean polysaccharide, known soybean polysaccharide can be used. For example, as a commercial product, SOYAFIVE (trade name, produced by Fuji Oil Co., Ltd.) is available and various grade products can be used. The soybean polysaccharide preferably used is that having viscosity in a range from 10 to 100 mPa/sec in the 10% by weight aqueous solution thereof.

As the modified starch, known modified starch can be used. The modified starch can be prepared, for example, by a method wherein starch, for example, of corn, potato, tapioca, rice or wheat is decomposed, for example, with an acid or an enzyme to an extent that the number of glucose residue per molecule is from 5 to 30 and then oxypropylene is added thereto in an alkali.

Two or more of the water-soluble polymer compounds may be used in combination. The content of the water-soluble polymer compound in the developer is preferably from 0.1 to 20% by weight, and more preferably from 0.5 to 10% by weight.

Into the developer for use in the simple development, a pH buffer agent may further be incorporated.

As the pH buffer agent according to the invention, any pH buffer agent exhibiting a pH buffer function at pH from 2 to 11 can be preferably used. In the invention, a weak alkaline buffer agent is preferably used and includes, for example, (a) a carbonate ion and a hydrogen carbonate ion, (b) a borate ion, (c) a water-soluble amine compound and an ion of the water-soluble amine compound, and combinations thereof. Specifically, for example, (a) a combination of a carbonate ion and a hydrogen carbonate ion, (b) a borate ion, or (c) a combination of a water-soluble amine compound and an ion of the water-soluble amine compound exhibits a pH buffer function in the developer to prevent fluctuation of the pH even when the developer is used for a long period of time. As a result, for example, the deterioration of development property resulting from the fluctuation of pH and the occurrence of development scum are restrained. The combination of a carbonate ion and a hydrogen carbonate ion is particularly preferred.

In order for a carbonate ion and a hydrogen carbonate ion to be present in the developer, a carbonate and a hydrogen carbonate may be added to the developer or a carbonate ion and a hydrogen carbonate ion may be generated by adding a carbonate or a hydrogen carbonate to the developer and then adjusting the pH. The carbonate or hydrogen carbonate used is not particularly restricted and it is preferably an alkali metal salt thereof. Examples of the alkali metal include lithium, sodium and potassium and sodium is particularly preferable. The alkali metals may be used individually or in combination of two or more thereof.

When the combination of (a) a carbonate ion and a hydrogen carbonate ion is adopted as the pH buffer agent, the total amount of the carbonate ion and hydrogen carbonate ion is preferably from 0.05 to 5 mole/l, more preferably from 0.1 to 2 mole/l, particularly preferably from 0.2 to 1 mole/l, in the developer.

The developer for use in the simple development may contain an organic solvent. As the organic solvent to be contained, for example, an aliphatic hydrocarbon (e.g., hexane, heptane, Isopar E, Isopar H, Isopar G (produced by Esso Chemical Co., Ltd.), gasoline or kerosene), an aromatic hydrocarbon (e.g., toluene or xylene), a halogenated hydrocarbon (methylene dichloride, ethylene dichloride, trichlene or monochlorobenzene) or a polar solvent is exemplified. Examples of the polar solvent include an alcohol (e.g., methanol, ethanol, propanol, isopropanol, 1-butanol, 1-pentanol, 1-hexanol, 1-heptanol, 1-octanol, 2-octanol, 2-ethyl-1-hexanol, 1-nonanol, 1-decanol, benzyl alcohol, ethylene glycol monomethyl ether, 2-ethyoxyethanol, diethylene glycol monoethyl ether, diethylene glycol monohexyl ether, triethylene glycol monomethyl ether, propylene glycol monoethyl ether, propylene glycol monomethyl ether, polyethylene glycol monomethyl ether, polypropylene glycol, tetraethylene glycol, ethylene glycol monobutyl ether, ethylene glycol monobenzyl ether, ethylene glycol monophenyl ether, propylene glycol monophenyl ether, methyl phenyl carbinol, n-amyl alcohol or methylamyl alcohol), a ketone (e.g., acetone, methyl ethyl ketone, ethyl butyl ketone, methyl isobutyl ketone or cyclohexanone), an ester (e.g., ethyl acetate, propyl acetate, butyl acetate, amyl acetate, benzyl acetate, methyl lactate, butyl lactate, ethylene glycol monobutyl acetate, polyethylene glycol monomethyl ether acetate, diethylene glycol acetate, diethyl phthalate or butyl levulinate) and others (e.g., triethyl phosphate, tricresyl phosphate, N-phenylethanolamine, N-phenyldiethanolamine, N-methyldiethanolamine, N-ethyldiethanolamine, 4-(2-hydroxyethyl)morpholine, N,N-dimethylacetamide or N-methylpyrrolidone). Two or more organic solvents may be used in combination.

Further, when the organic solvent is insoluble in water, it may be employed by being solubilized in water using a surfactant or the like. In the case where the developer contains an organic solvent, the concentration of the organic solvent is desirably less than 40% by weight in view of safety and inflammability.

The developer may contain a preservative, a chelating agent, a defoaming agent, an organic acid, an inorganic acid, an inorganic salt or the like in addition the components described above. Specifically, compounds described in Paragraph Nos. [0266] to [0270] of JP-A-2007-206217 are preferably used.

The developer described above can be used as a developer and a development replenisher for the exposed negative lithographic printing plate precursor and it is preferably applied to an automatic processor described hereinafter. In the case of conducting the development processing using an automatic processor, the processing solution becomes fatigued in accordance with the processing amount, and hence the processing ability may be restored using a replenisher or a fresh developer.

The development processing using the developer having pH from 2 to 11 according to the invention is preferably performed by an automatic processor equipped with a supplying means for the developer and a rubbing member. An automatic processor using a rotating brush roll as the rubbing member is particularly preferred. Further, the automatic processor is preferably provided with a means for removing the excess developer, for example, a squeeze roller or a drying means, for example, a hot air apparatus, subsequently to the development processing means.

Further, in the plate making process of preparing a lithographic printing plate from the lithographic printing plate precursor according to the invention, the lithographic printing plate precursor may be heated its entire surface before or during the exposure or between the exposure and the development, if desired. By the heating, the image-forming reaction in the image-recording layer is accelerated and advantages, for example, improvement in the sensitivity and printing durability and stabilization of the sensitivity are achieved. For the purpose of increasing the image strength and printing durability, it is also effective to perform entire after-heating or entire exposure of the image after the development. Ordinarily, the heating before the development is preferably performed under a mild condition of 150° C. or lower. When the temperature is too high, a problem may arise sometimes in that the unexposed area is also cured. On the other hand, the heating after the development can be performed using very strong conditions. Ordinarily, the heat treatment is carried out in a temperature range from 100 to 500° C. When the temperature is too low, a sufficient effect of strengthening the image may not be obtained, whereas when it is excessively high, problems of deterioration of the support and thermal decomposition of the image area may occur sometimes.

EXAMPLES

The present invention will be described in more detail with reference to the following examples, but the invention should not be construed as being limited thereto. With respect to the polymer compounds used in the examples, unless otherwise particularly defined, a molecular weight means a weight average molecular weight (Mw) and a ratio of repeating units is indicated in mole percent.

Synthesis Example of Star Polymer

Synthesis of Star Polymer (P-28)

To 37.97 g of 1-methoxy-2-propanol heated at 70° C. under nitrogen stream was dropwise added a mixed solution composed of 51.65 g of methacrylic acid, 0.392 g of dipentaerythritolhexakis(3-mercaptopropionate), 0.691 g of V-601 (produced by Wako Pure Chemical Industries, Ltd.) and 39.98 g of 1-methoxy-2-propanol over a period of 2 hours and 30 minutes. After the completion of the dropwise addition, the reaction mixture was continued to stir as it was for 2 hours, then a solution prepared by dissolving 0.069 g of V-601 in 0.876 g of 1-methoxy-2-propanol was added thereto, and the temperature was raised to 90° C., followed by continuing the reaction for 2 hours and 30 minutes. After the reaction, the reaction mixture was cooled to 50° C. and a mixed solution composed of 0.020 g of 4-hydroxy-2,2,6,6-tetramethylpyridine-1-oxide free radical, 56.84 g of allyl glycidyl ether and 45.87 g of 1-methoxy-2-propanol was added thereto, followed by stirring for 5 minutes. The reaction mixture was heated to 90° C., stirred for 10 minutes, and then 5.00 g of tetraethylammonium bromide was added thereto and the tetraethylammonium bromide attached to the wall of the reaction vessel was washed with 45.00 g of 1-methoxy-2-propanol. After stirring at 90° C. for 18 hours, the reaction mixture was diluted by adding 1-methoxy-2-propanol. The weight average molecular weight (Mw) of Star polymer (P-28) shown in Table 8 hereinbefore in the thus-obtained solution measured by GPC was 98,000 and the solid content concentration was 24.5% by weight.

Examples 1 to 9 and Comparative Example 1

Preparation of Support 1

An aluminum plate having a thickness of 0.3 mm was immersed in an aqueous 10% by weight sodium hydroxide solution at 60° C. for 25 seconds to effect etching, washed with running water, neutralized and cleaned with an aqueous 20% by weight nitric acid solution and then washed with water. The aluminum plate was subjected to an electrolytic surface roughening treatment in an aqueous 1% by weight nitric acid solution using an alternating current with a sinusoidal waveform at an anode time electricity of 300 coulomb/$dm^2$. Subsequently, the aluminum plate was immersed in an aqueous 1% by weight sodium hydroxide solution at 40° C. for 5 seconds, immersed in an aqueous 30% by weight sulfuric acid solution at 60° C. for 40 seconds to effect a desmut treatment, and then subjected to an anodizing treatment in an aqueous 20% by weight sulfuric acid solution for 2 minutes at a current density of 2 $A/dm^2$ so as to form an anodic oxide film having a thickness of 2.7 $g/m^2$. The center line average roughness of the thus-treated aluminum plate was measured and found to be 0.3 μm (Ra indication according to JIS B 0601).

On the back surface of the aluminum plate thus-treated, a coating solution for backcoat layer shown below was coated by a bar coater and dried at 100° C. for 1 minute, thereby preparing Support 1 having provided thereon a backcoat layer having a coating amount after drying of 70 $mg/m^2$.

<Coating Solution for Backcoat Layer>

The sol-gel reaction solution component shown blow was mixed and stirred, and heat generation was started within about 5 minutes. After the mixture was subjected to reaction for 60 minutes, the addition solution shown below was added thereto to prepare a coating solution for backcoat layer.

<Sol-Gel Reaction Solution>

| | |
|---|---|
| Tetraethyl silicate | 50 parts by weight |
| Water | 20 parts by weight |
| Methanol | 15 parts by weight |
| Phosphoric acid | 0.05 parts by weight |

<Addition Solution>

| | |
|---|---|
| Pyrogallol formaldehyde condensation resin (Mw: 2,000) | 4 parts by weight |
| Dimethyl phthalate | 5 parts by weight |
| Fluorine-based surfactant (N-Butylperfluorooctane-sulfonamidoethyl acrylate/polyoxyethylene acrylate copolymer, Mw: 20,000) | 0.7 parts by weight |
| Methanol silica sol (produced by Nissan Chemical Industries, Ltd., 30% by weight in methanol) | 50 parts by weight |
| Methanol | 800 parts by weight |

(Formation of Image-recording Layer)

Coating solution (1) for image-forming layer having the composition shown below was coated on the aluminum plate (Support 1) treated as described above so as to have a dry coating amount of 1.5 g/m² and dried at 100° C. for one minute to form an image-recording layer.

<Coating Solution (1) for Image-recording Layer>

| | |
|---|---|
| Polymerizable compound (R-1) | 2.0 g |
| Star polymer (P-1 to P-6, P-21 to P-23 or C-1) shown in Table 10 | 2.0 g |
| Sensitizing dye (Y-1) | 0.08 g |
| Polymerization initiator (X-1) | 0.3 g |
| Fluorine-based nonionic surfactant MEGAFAC F-780-F, produced by DIC Corp., 30% by weight methyl isobutyl ketone (MIBK) solution | 0.01 g |
| Naphthalenesulfonate salt of Victoria Pure Blue | 0.04 g |
| Methyl ethyl ketone | 9.0 g |
| Propylene glycol monomethyl ether | 8.0 g |
| Methanol | 10.0 g |

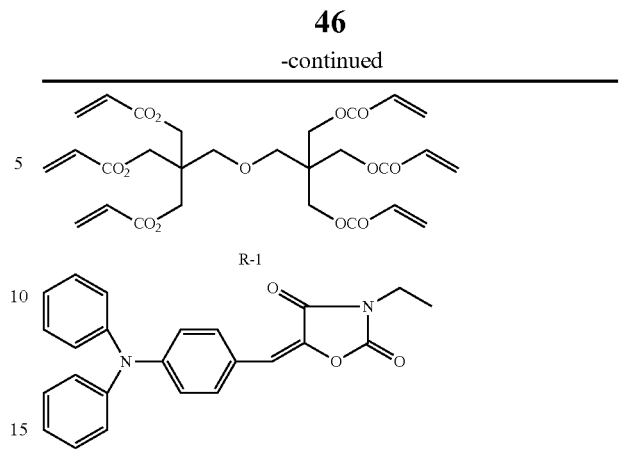

X-1: CGI-784 (produced by Ciba-Geigy Ltd.)

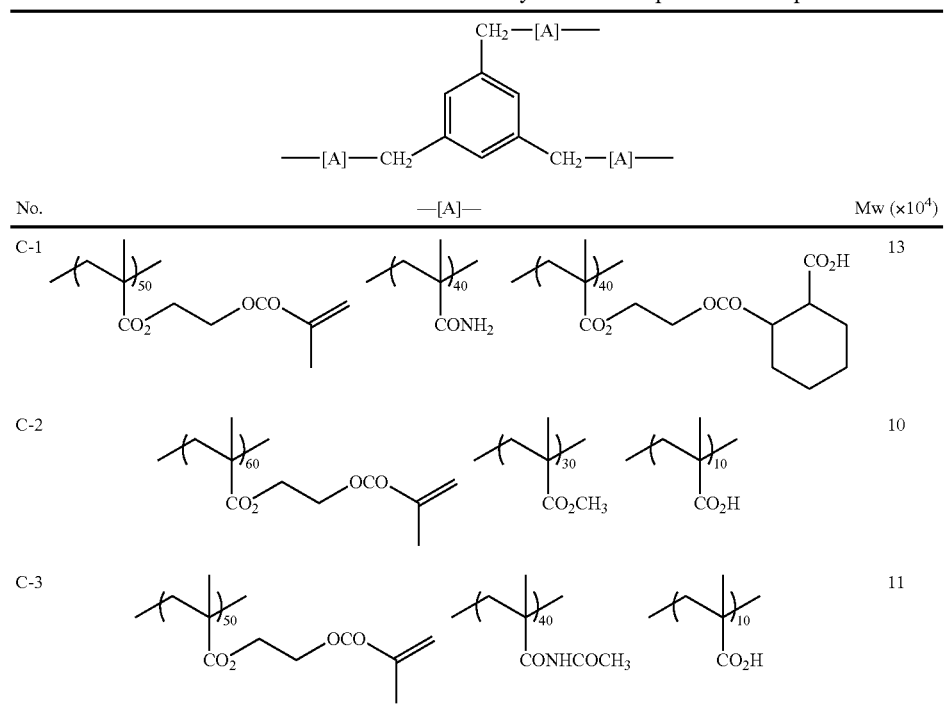

(Formation of Protective Layer)

An aqueous 3% by weight solution of polyvinyl alcohol (saponification degree: 98% by mole, polymerization degree: 550) was coated on the image-recording layer described above so as to have a dry coating amount of 2 g/m² and dried at 100° C. for 2 minutes, thereby preparing lithographic printing plate precursors for Examples 1 to 9 and Comparative Example 1, respectively.

(Exposure of Lithographic Printing Plate Precursor)

Each of the lithographic printing plate precursors for Examples 1 to 9 and Comparative Example 1 was subjected to scanning exposure using InGaN semiconductor laser having an emission wavelength of 400 nm under conditions of a beam spot on the surface of lithographic printing plate precursor of 25 μm and an exposure energy density of 0.15 mJ/cm².

(Development/Plate Making)

After the exposure, the exposed lithographic printing plate precursor was subjected to development/plate making at 30° C. using an automatic developing machine (STABLON 900N, produced by FUJIFILM Corp.) charged with a developer shown below and a finisher (a solution prepared by diluting FN-6 (produced by FUJIFILM Corp.) with water in a ratio of 1:1) to prepare a lithographic printing plate.

<Developer>

| Water | 800 g |
| DV-2 (produced by FUJIFILM Corp.) | 200 g |

(Evaluation)

1. Evaluation of Printing Durability (1) A printing machine (LITHRONE, produced by Komori Corp.) was used for test of printing durability of image area and SPACE COLOR FUSION G (N) (produced by DIC Graphics Corp.) was used as ink. The solid image area in the printed material was observed and a number of the printed materials when the image began to become thin was determined to evaluate the printing durability of image area.

(2) A printing machine (LITHRONE, produced by Komori Corp.) was used for forced test of printing durability of halftone dot and SPACE COLOR FUSION G (N) (produced by DIC Graphics Corp.) was used as ink. At the 5,000th sheet from the initiation of printing, the halftone dot image area was wiped with a sponge for printing impregnated with PS PLATE CLEANER CL-2 (produced by FUJIFILM Corp.) to clean the ink on the surface of lithographic printing plate. The printing was further conducted 10,000 sheets and the presence or absence of disappearance of the halftone dot on the printed material was visually observed to evaluate the printing durability of halftone dot according to the criteria shown below.

A: The disappearance of halftone dot was not observed.
B: The disappearance from 1 to 10 halftone dots of 100 halftone dots was observed.

2. Evaluation of Development Speed

The exposed lithographic printing plate precursor was immersed in the developer described above while changing the immersion time, wiped off the developer, and washed with water. The density of the non-image area of the lithographic printing plate obtained was measured by a densitometer (Gretag Macbeth RD 918). The immersion time in the developer necessary for obtaining the density same as that of the aluminum surface was determined to evaluate the development speed. The shorter immersion time indicates the larger development speed.

TABLE 10

| | | Printing Durability | | |
|---|---|---|---|---|
| Lithographic Printing Plate Precursor | Star Polymer | Image Area (sheets) (×10⁴) | Halftone Dot | Development Speed (sec) |
| Example 1 | (1) | P-1 | 3 | A | 10 |
| Example 2 | (2) | P-2 | 3.5 | A | 10 |
| Example 3 | (3) | P-3 | 3.2 | A | 9 |
| Example 4 | (4) | P-4 | 3.5 | A | 8 |
| Example 5 | (5) | P-5 | 3.5 | A | 8 |
| Example 6 | (6) | P-6 | 3.4 | A | 7 |
| Example 7 | (7) | P-21 | 3.2 | A | 11 |
| Example 8 | (8) | P-22 | 3.5 | A | 11 |

TABLE 10-continued

| | | Printing Durability | | |
|---|---|---|---|---|
| Lithographic Printing Plate Precursor | Star Polymer | Image Area (sheets) (×10⁴) | Halftone Dot | Development Speed (sec) |
| Example 9 | (9) | P-23 | 3.5 | A | 11 |
| Comparative Example 1 | (10) | C-1 | 2.5 | A | 12 |

As is apparent from the results shown in Table 10, the lithographic printing plate precursor according to the invention is excellent in the printing durability and development speed in comparison with the conventional lithographic printing plate precursor.

Examples 10 to 17 and Comparative Example 2

(Formation of Image-recording Layer)

Coating solution (2) for image-forming layer having the composition shown below was coated on the aluminum plate (Support 1) treated as described above so as to have a dry coating amount of 1.5 g/m² and dried at 100° C. for one minute to form an image-recording layer.

<Coating Solution (2) for Image-Recording Layer>

| Polymerizable compound (R-1) | 2.0 g |
| Star polymer (P-7 to P-14 or C-2) shown in Table 11 | 2.0 g |
| Sensitizing dye (Y-3) | 0.08 g |
| Polymerization initiator (X-1) | 0.3 g |
| Fluorine-based nonionic surfactant MEGAFAC F-780-F, produced by DIC Corp., 30% by weight methyl isobutyl ketone (MIBK) solution | 0.01 g |
| Naphthalenesulfonate salt of Victoria Pure Blue | 0.04 g |
| Methyl ethyl ketone | 9.0 g |
| Propylene glycol monomethyl ether | 8.0 g |
| Methanol | 10.0 g |

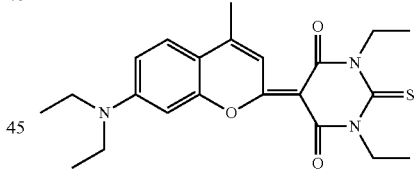

Y-3

(Formation of Protective Layer)

An aqueous 3% by weight solution of polyvinyl alcohol (saponification degree: 98% by mole, polymerization degree: 550) was coated on the image-recording layer described above so as to have a dry coating amount of 2 g/m² and dried at 100° C. for 2 minutes, thereby preparing lithographic printing plate precursors for Examples 10 to 17 and Comparative Example 2, respectively.

(Evaluation of Lithographic Printing Plate Precursor)

The lithographic printing plate precursor prepared above was exposed using an FD-YAG (532 nm) laser exposure machine (plate setter, Gutenberg, produced by Heidelberg) so as to have the exposure energy density on the surface of lithographic printing plate precursor of 200 µJ/cm².

The exposed lithographic printing plate precursor was subjected to the development processing and evaluated in the same manner as in Example 1.

TABLE 11

| Lithographic Printing Plate Precursor | Star Polymer | Printing Durability Image Area (sheets) (×10⁴) | Halftone Dot | Development Speed (sec) |
|---|---|---|---|---|
| Example 10 | (11) | P-7 | 3.8 | A | 7 |
| Example 11 | (12) | P-8 | 3.3 | A | 10 |
| Example 12 | (13) | P-9 | 3.4 | A | 10 |
| Example 13 | (14) | P-10 | 3.6 | A | 9 |
| Example 14 | (15) | P-11 | 3.6 | A | 9 |
| Example 15 | (16) | P-12 | 3.4 | A | 8 |
| Example 16 | (17) | P-13 | 3.5 | A | 8 |
| Example 17 | (18) | P-14 | 3.4 | A | 8 |
| Comparative Example 2 | (19) | C-2 | 3.0 | B | 12 |

As is apparent from the results shown in Table 11, the lithographic printing plate precursor according to the invention is excellent in the printing durability and development speed in comparison with the conventional lithographic printing plate precursor.

Examples 18 to 23 and Comparative Example 3

(Formation of Image-recording Layer)

Coating solution (3) for image-forming layer having the composition shown below was coated on the aluminum plate (Support 1) treated as described above so as to have a dry coating amount of 1.5 g/m² and dried at 100° C. for one minute to form an image-recording layer, thereby preparing lithographic printing plate precursors for Examples 18 to 23 and Comparative Example 3, respectively.

<Coating Solution (3) for Image-Recording Layer>

| | |
|---|---|
| Polymerizable compound (R-2) | 2.0 g |
| Star polymer (P-15 to P-20 or C-3) shown in Table 12 | 2.0 g |
| Sensitizing dye (Y-6) | 0.08 g |
| Polymerization initiator (X-4) | 0.3 g |
| Fluorine-based nonionic surfactant MEGAFAC F-780-F, produced by DIC Corp., 30% by weight methyl isobutyl ketone (MIBK) solution | 0.01 g |
| Naphthalenesulfonate salt of Victoria Pure Blue | 0.04 g |
| Methyl ethyl ketone | 9.0 g |
| Propylene glycol monomethyl ether | 8.0 g |
| Methanol | 10.0 g |

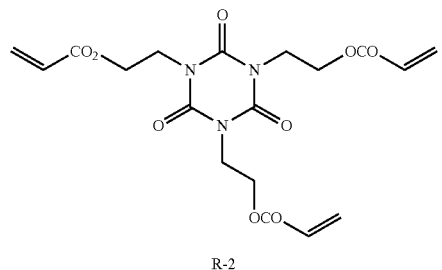

R-2

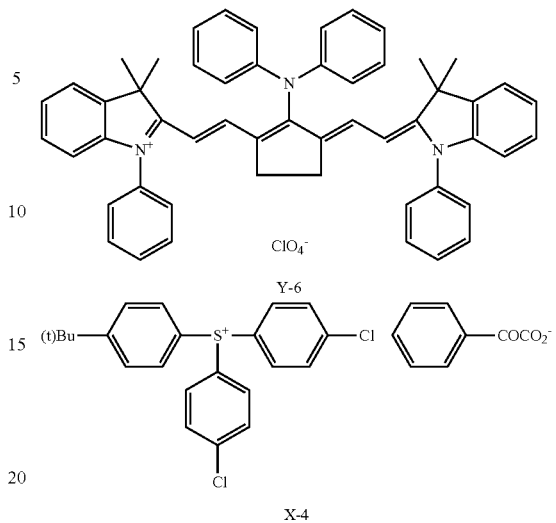

Y-6

X-4

(Evaluation of Lithographic Printing Plate Precursor)

The lithographic printing plate precursor prepared above was exposed by TRENDSETTER 3244VFS, produced by Creo Co., equipped with a water-cooled 40 W infrared semiconductor laser under the conditions of output of 9 W, a rotational number of an external drum of 210 rpm, energy on the surface of lithographic printing plate precursor of 100 mJ/cm² and resolution of 2,400 dpi.

The exposed lithographic printing plate precursor was subjected to the development processing and evaluated in the same manner as in Example 1.

TABLE 12

| Lithographic Printing Plate Precursor | Star Polymer | Printing Durability Image Area (sheets) (×10⁴) | Halftone Dot | Development Speed (sec) |
|---|---|---|---|---|
| Example 18 | (20) | P-15 | 2 | A | 10 |
| Example 19 | (21) | P-16 | 2.5 | A | 8 |
| Example 20 | (22) | P-17 | 2.2 | A | 9 |
| Example 21 | (23) | P-18 | 2.4 | A | 8 |
| Example 22 | (24) | P-19 | 2.5 | A | 7 |
| Example 23 | (25) | P-20 | 2.5 | A | 7 |
| Comparative Example 3 | (26) | C-3 | 1.5 | B | 12 |

As is apparent from the results shown in Table 12, the lithographic printing plate precursor according to the invention is excellent in the printing durability and development speed in comparison with the conventional lithographic printing plate precursor.

Examples 24 to 35

Preparation of Support 2

An aluminum plate (material: JIS A 1050) having a thickness of 0.3 mm was subjected to a degreasing treatment at 50° C. for 30 seconds using a 10% by weight aqueous sodium aluminate solution in order to remove rolling oil on the surface thereof and then grained the surface thereof using three nylon brushes embedded with bundles of nylon bristle having a diameter of 0.3 mm and an aqueous suspension (specific gravity: 1.1 g/cm$^3$) of pumice having a median size of 25 μm, followed by thorough washing with water. The plate was subjected to etching by immersing in a 25% by weight aqueous sodium hydroxide solution of 45° C. for 9 seconds, washed with water, then immersed in a 20% by weight aqueous nitric acid solution at 60° C. for 20 seconds, and washed with water. The etching amount of the grained surface was about 3 g/m$^2$.

Then, using an alternating current of 60 Hz, an electrochemical roughening treatment was continuously carried out on the plate. The electrolytic solution used was a 1% by weight aqueous nitric acid solution (containing 0.5% by weight of aluminum ion) and the temperature of electrolytic solution was 50° C. The electrochemical roughening treatment was conducted using an alternating current source, which provides a rectangular alternating current having a trapezoidal waveform such that the time TP necessary for the current value to reach the peak from zero was 0.8 msec and the duty ratio was 1:1, and using a carbon electrode as a counter electrode. A ferrite was used as an auxiliary anode. The current density was 30 A/dm$^2$ in terms of the peak value of the electric current and 5% of the electric current flowing from the electric source was divided to the auxiliary anode. The quantity of electricity in the nitric acid electrolysis was 175 C/dm$^2$ in terms of the quantity of electricity when the aluminum plate functioned as an anode. The plate was then washed with water by spraying.

The plate was further subjected to an electrochemical roughening treatment in the same manner as in the nitric acid electrolysis above using as an electrolytic solution, a 0.5% by weight aqueous hydrochloric acid solution (containing 0.5% by weight of aluminum ion) having temperature of 50° C. and under the condition that the quantity of electricity was 50 C/dm$^2$ in terms of the quantity of electricity when the aluminum plate functioned as an anode. The plate was then washed with water by spraying.

The plate was then subjected to an anodizing treatment using as an electrolytic solution, a 15% by weight aqueous sulfuric acid solution (containing 0.5% by weight of aluminum ion) at a current density of 15 A/dm$^2$ to form a direct current anodized film of 2.5 g/m$^2$, washed with water and dried to prepare Support 2.

The center line average roughness (Ra) of the support thus obtained was measured using a stylus having a diameter of 2 μm and found to be 0.51 μm.

(Formation of Undercoat Layer)

Coating solution (1) for undercoat layer shown below was coated on Support 2 described above by a bar and dried in an oven at 80° C. for 10 seconds to prepare a support having an undercoat layer having a dry coating amount of 10 mg/m$^2$.

<Coating Solution (1) for Undercoat Layer>

| | |
|---|---|
| Compound (1) for undercoat shown below | 0.017 g |
| Methanol | 9.00 g |
| Water | 1.00 g |

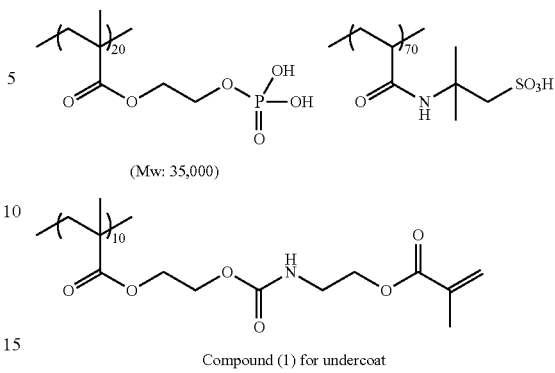

Compound (1) for undercoat (3) Formation of Image-Recording Layer and Protective Layer Coating solution (4) for image-recording layer having the composition shown below was coated on the support having an undercoat layer described above by a bar and dried in an oven at 70° C. for 60 seconds to form an image-recording layer having a dry coating amount of 1.1 g/m$^2$. Coating solution (1) for protective layer having the composition shown below was coated on the image-recording layer using a bar so as to have a dry coating amount of 0.75 g/m$^2$ and dried at 125° C. for 70 seconds to form lithographic printing plate precursors for Examples 24 to 35, respectively.

<Coating Solution (4) for Image-Recording Layer>

| | |
|---|---|
| Star polymer shown in Table 13 | 0.54 g |
| Polymerizable compound (1) shown below | 0.48 g |
| Sensitizing dye (1) shown below | 0.06 g |
| Polymerization initiator (1) shown below | 0.18 g |
| Co-sensitizer (1) shown below | 0.07 g |
| Dispersion of ε-phthalocyanine pigment (1) [pigment: 15 parts by weight; dispersing agent (allyl methacrylate/methacrylic acid (80/20) copolymer, Mw: 50,000): 10 parts by weight; solvent (cyclohexanone/methoxypropyl acetate/1-methoxy-2-propanol = 15 parts by weight/20 parts by weight/40 parts by weight)] | 0.40 g |
| Thermal polymerization inhibitor N-Nitrosophenylhydroxylamine aluminum salt | 0.01 g |
| Fluorine-based surfactant (1) shown below (Mw: 13,000) | 0.001 g |
| Polyoxyethylene-polyoxypropylene condensate (PLURONIC L44, produced by ADEKA Corp.) | 0.04 g |
| 1-Methoxy-2-propanol | 3.5 g |
| Methyl ethyl ketone | 8.0 g |

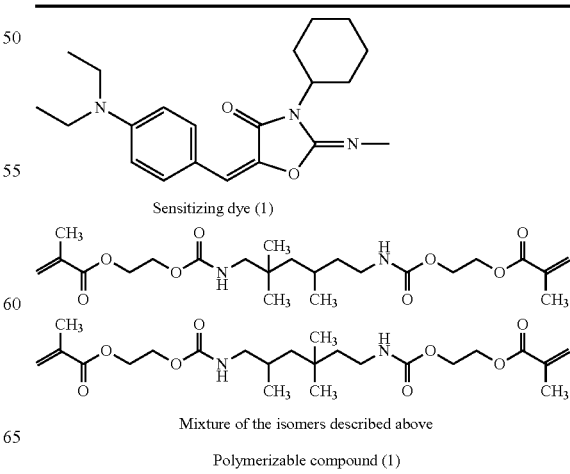

Sensitizing dye (1)

Mixture of the isomers described above

Polymerizable compound (1)

-continued

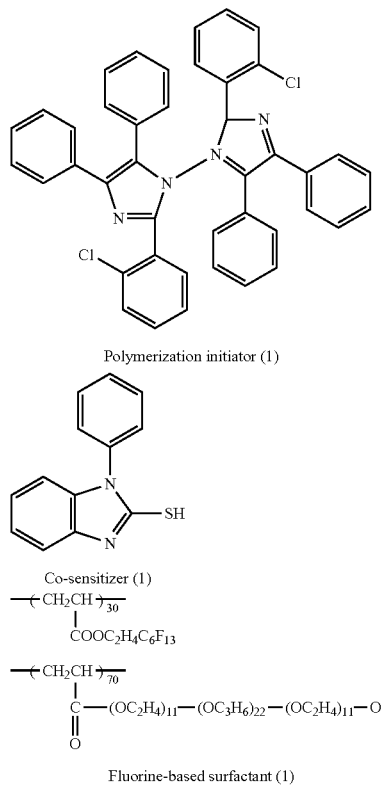

Polymerization initiator (1)

Co-sensitizer (1)

$-(\text{CH}_2\text{CH})_{30}-$
  |
  $\text{COOC}_2\text{H}_4\text{C}_6\text{F}_{13}$ $-(\text{CH}_2\text{CH})_{70}-$
  |
  $\text{C}-(\text{OC}_2\text{H}_4)_{11}-(\text{OC}_3\text{H}_6)_{22}-(\text{OC}_2\text{H}_4)_{11}-\text{OH}$
  ||
  $\text{O}$ Fluorine-based surfactant (1)

<Coating Solution (1) for Protective Layer>

| | |
|---|---|
| Dispersion of mica (1) shown below | 13.0 g |
| Polyvinyl alcohol (saponification degree: 98% by mole; polymerization degree: 500) | 1.3 g |
| Sodium 2-ethylhexylsulfosuccinate | 0.2 g |
| Vinyl pyrrolidone/vinyl acetate (1/1) copolymer (Mw: 70,000) | 0.05 g |
| Surfactant (EMALEX 710, produced by Nihon-Emulsion Co., Ltd.) | 0.05 g |
| Water | 133 g |

(Preparation of Dispersion of Mica (1))

To 368 g of water was added 32 g of synthetic mica (SOMASIF ME-100, produced by CO-OP Chemical Co., Ltd., aspect ratio: 1,000 or more) and the mixture was dispersed using a homogenizer until an average particle size (according to a laser scattering method) became 0.5 μm to prepare Dispersion of mica (1).

<Conditions of Exposure and Development>
(1) Condition of Preparing Standard Lithographic Printing Plate Each of Lithographic printing plate precursors obtained as mentioned above was subjected to imagewise exposure using a semiconductor laser of 405 nm having output of 100 mW in an exposure amount of 300 μJ/cm².

Figure 2:
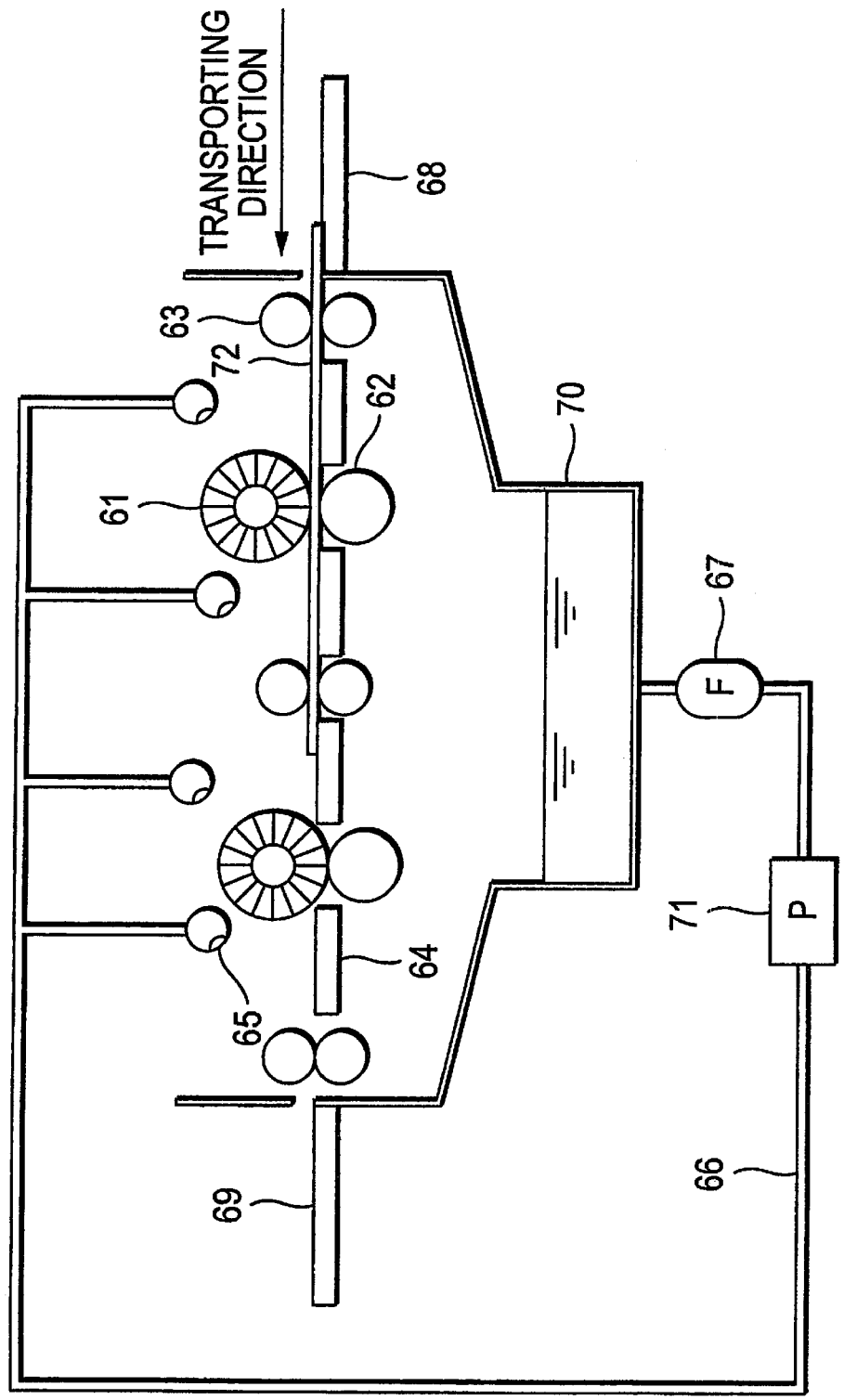
FIG. 2 is a view explaining a structure of an automatic development processor (A).

Then, the exposed lithographic printing plate precursor was subjected to development processing in Automatic development processor (A) having a structure shown in FIG. 2 using Developer (2) having the composition shown below. Automatic development processor (A) was an automatic processor having two rotating brush rollers. The first brush roller was a brush roller having an outer diameter of 90 mm and being implanted with fiber of polybutylene terephthalate (bristle diameter: 200 μm, bristle length: 17 mm), and the brush roller was rotated at 200 rpm (peripheral velocity at the tip of brush: 0.94 msec) in the same direction as the transporting direction of the lithographic printing plate precursor. The second brush roller was a brush roller having an outer diameter of 60 mm and being implanted with fiber of polybutylene terephthalate (bristle diameter: 200 μm, bristle length: 17 mm), and the brush roller was rotated at 200 rpm (peripheral velocity at the tip of brush: 0.63 msec) in the opposite direction to the transporting direction of the lithographic printing plate precursor. The transportation of the lithographic printing plate precursor was conducted at a transporting speed of 100 cm/min.

The developer was supplied on the surface of the lithographic printing plate precursor by showering from a spray pipe using a circulation pump. The tank volume for the developer was 10 liters. Thus, Standard lithographic printing plates (24) to (43) were prepared.

(2) Condition of Preparing Post-Heated Lithographic Printing Plate

Each of the lithographic printing plate precursors prepared above was subjected to imagewise exposure using a semiconductor laser of 405 nm having output of 100 mW in an exposure amount of 90 μJ/cm² and within 30 seconds the exposed lithographic printing plate precursor was put in an oven to heat the whole surface thereof by blowing hot air at 110° C. for 15 seconds. Then, within 30 seconds the lithographic printing plate precursor was subjected to the development processing in the same manner as in Condition of preparing standard lithographic printing plate to prepare Post-heated lithographic printing plates (24) to (43), respectively.

(3) Condition of Preparing Lithographic Printing Plate for Evaluating Sensitivity Each of the lithographic printing plate precursors prepared above was subjected to imagewise exposure using a semiconductor laser of 405 nm having output of 100 mW while changing the exposure amount. Then, the exposed lithographic printing plate precursor was subjected to the development processing in the same manner as in Condition of preparing standard lithographic printing plate to prepare Lithographic printing plates (24) to (43) for evaluating sensitivity, respectively.

(4) Condition of Preparing Lithographic Printing Plate for Evaluating Development Property Each of the lithographic printing plate precursors prepared above was subjected to the imagewise exposure in the same manner as in Condition of preparing standard lithographic printing plate and then subjected to the development processing in the same manner as in Condition of preparing standard lithographic printing plate except for variously changing the transporting speed of the lithographic printing plate precursor to prepare Lithographic printing plates (24) to (43) for evaluating development property.

<Developer (2)>

| | |
|---|---|
| Water | 100.00 g |
| Benzyl alcohol | 1.00 g |
| Polyoxyethylene naphthyl ether (average number of oxyethylene: n = 13) | 1.00 g |
| Sodium salt of dioctylsulfosuccinate | 0.50 g |
| Gum arabic | 1.00 g |
| Ethylene glycol | 0.50 g |
| Ammonium primary phosphate | 0.05 g |
| Citric acid | 0.05 g |
| Sodium carbonate | 1.40 g |
| Sodium hydrogen carbonate | 0.59 g |

(pH of the developer was adjusted to 9.8 using phosphoric acid and sodium hydroxide)

<Condition of Printing>

The lithographic printing plate obtained was mounted on a printing machine (SOR-M, produced by Heidelberg) and printing was conducted at a printing speed of 6,000 sheets per hour using dampening water (EU-3 (etching solution, produced by FUJIFILM Corp.))/water/isopropyl alcohol=1/89/10 (by volume ratio)) and SPACE COLOR FUSION G (N) (produced by DIC Graphics Corp.).

(Evaluation)

Using the lithographic printing plate precursor prepared, sensitivity, development property, stain resistance and printing durability were evaluated in the manner described below. The results obtained are shown in Table 13.

<Sensitivity>

Using the lithographic printing plate for evaluating sensitivity, the printing of 100 sheets was conducted under the condition described above to confirm to obtain a printed material having no stain in the non-image area and the printing was continued further 500 sheets. On the 600th sheet of the printed material, the exposure amount ($\mu J/cm^2$) in which unevenness was not observed in the ink density of the image area was determined to evaluate the sensitivity.

<Development Property>

With the lithographic printing plate for evaluating development property, cyan density of the non-image area was measured by Macbeth densitometer. The transporting speed (cm/min) at which the cyan density of the non-image area became equivalent to the cyan density of the aluminum support was determined to evaluate the development property.

<Stain Resistance>

Using the standard lithographic printing plate and post-heated lithographic printing plate, the printing of 500 sheets was conducted under the condition described above. On the 500th sheet of the printed material, ink satin generated in the non-image area was visually observed to evaluate the stain resistance on a 1 to 10 bases, 1 being a case where due to adhesion of ink the non-image area was almost stained and 10 being a case where the non-image area did not stained at all.

<Printing Durability>

Using the standard lithographic printing plate and post-heated lithographic printing plate, the printing was conducted under the condition described above and a number of printed materials obtained until the ink density (reflection density) on the printing paper decreased by 0.1 from that at the initiation of printing was determined to evaluate the printing durability.

Examples 36 to 51

Preparation of Support 3

An aluminum plate of JIS A 1050 having a thickness of 0.30 mm and a width of 1,030 mm was continuously subjected to surface treatment according to various treatments (a) to (f) shown below. After each treatment and water washing, removal of liquid was conducted with a nip roller.

(a) Alkali etching treatment of the aluminum plate was conducted by spraying an aqueous solution having sodium hydroxide concentration of 26% by weight, aluminum ion concentration of 6.5% by weight and temperature of 70° C. to dissolve the aluminum plate in an amount of 5 $g/m^2$. Subsequently, the plate was washed with water.

(b) Desmut treatment of the aluminum plate was conducted by spraying an aqueous 1% by weight nitric acid solution (containing 0.5% by weight of aluminum ion) having temperature of 30° C. Subsequently, the plate was washed with water.

(c) Electrochemical surface roughening treatment of the aluminum plate was continuously conducted by applying 60 Hz alternating current voltage. The electrolytic solution used was an aqueous 1% by weight nitric acid solution (containing 0.5% by weight of aluminum ion and 0.007% by weight of ammonium ion) and the solution temperature was 30° C. The electrochemical surface roughening treatment was conducted using a trapezoidal rectangular wave alternating current where time (TP) for reaching the current to its peak from zero was 0.8 msec and a duty ratio was 1:1 as an alternating current source, and using a carbon electrode as a counter electrode. A ferrite was used as an auxiliary anode. The current density was 25 $A/dm^2$ at the peak current, and the electric quantity was 250 $C/dm^2$ in terms of the total electric quantity during the aluminum plate functioning as an anode. To the auxiliary anode, 5% of the current flowing from the electric source was divided. Subsequently, the plate was washed with water.

(d) Alkali etching treatment of the aluminum plate was conducted at 35° C. by spraying an aqueous solution having a sodium hydroxide concentration of 26% by weight and an aluminum ion concentration of 6.5% by weight to dissolve the aluminum plate in an amount of 0.2 $g/m^2$. Thus, the smut component mainly comprising aluminum hydroxide formed in the precedent process of electrochemical surface roughening treatment using alternating current was removed and an edge portion of the pit formed was dis-

TABLE 13

| | Lithographic Printing Plate Precursor | Star Polymer | Sensitivity ($\mu J/cm^2$) | Development Property (cm/min) | Stain Resistance | | Printing Durability (sheets) | |
|---|---|---|---|---|---|---|---|---|
| | | | | | Standard | Post-heated | Standard ($\times 10^4$) | Post-heated ($\times 10^4$) |
| Example 24 | (27) | P-28 | 150 | 110 | 10 | 10 | 10.0 | 12.0 |
| Example 25 | (28) | P-29 | 155 | 107 | 10 | 10 | 9.0 | 10.0 |
| Example 26 | (29) | P-30 | 160 | 105 | 10 | 10 | 8.0 | 9.0 |
| Example 27 | (30) | P-31 | 165 | 105 | 10 | 10 | 7.5 | 8.5 |
| Example 28 | (31) | P-32 | 155 | 107 | 10 | 10 | 9.0 | 10.0 |
| Example 29 | (32) | P-33 | 165 | 105 | 10 | 10 | 7.5 | 8.5 |
| Example 30 | (33) | P-34 | 155 | 107 | 10 | 10 | 9.0 | 10.0 |
| Example 31 | (34) | P-35 | 150 | 110 | 10 | 10 | 10.0 | 12.0 |
| Example 32 | (35) | P-36 | 150 | 110 | 10 | 10 | 10.0 | 12.0 |
| Example 33 | (36) | P-37 | 150 | 110 | 10 | 10 | 10.0 | 12.0 |
| Example 34 | (37) | P-38 | 150 | 110 | 10 | 10 | 10.0 | 12.0 |
| Example 35 | (38) | P-39 | 150 | 110 | 10 | 10 | 10.0 | 12.0 | solved to smoothen the edge portion. Subsequently, the plate was washed with water.

(e) Desmut treatment of the aluminum plate was conducted by spraying an aqueous 25% by weight sulfuric acid solution (containing 0.5% by weight of aluminum ion) having temperature of 60° C. Subsequently, the plate was washed with water by spraying.

(f) Anodizing treatment of the aluminum plate was conducted in an aqueous solution having sulfuric acid concentration of 170 g/liter (containing 0.5% by weight of aluminum ion) at temperature of 33° C. and an electric density of 5 A/dm² for 50 seconds. Subsequently, the plate was washed with water. The amount of the anodic oxide film was 2.7 g/m².

The surface roughness (Ra) of Support 3 thus-obtained was 0.27 (measuring instrument: SURFCOM having a stylus with a tip diameter of 2 μm, produced by Tokyo Seimitsu Co. Ltd.).

(Formation of Undercoat Layer)

Coating solution (2) for undercoat layer shown below was coated on Support 3 by a wire bar and dried at 90° C. for 30 seconds. The coating amount of the undercoat layer was 10 mg/m².

<Coating Solution (2) for Undercoat Layer>

| | |
|---|---|
| Polymer compound A having structure shown below | 0.05 g |
| Methanol | 27 g |
| Ion-exchanged water | 3 g |

Polymer compound A (Mw: 50,000)

(Formation of Image-Recording Layer)

Coating solution (5) for image-recording layer shown below was prepared and coated on the undercoat layer described above by a wire bar. Drying was conducted in a hot air drying apparatus at 115° C. for 34 seconds to form an image-recording layer. The coverage of the image-recording layer after drying was 1.4 g/m².

<Coating Solution (5) for Image-Recording Layer>

| | |
|---|---|
| Phosphonium compound (A-6) | 0.077 g |
| Infrared absorbing agent (IR-1) | 0.074 g |
| Polymerization initiator (OS-12) | 0.280 g |
| Additive (PM-1) | 0.151 g |
| Polymerizable compound (AM-1) | 1.00 g |
| Star polymer (P-40 to P-55) shown in Table 14 | 1.00 g |
| Ethyl violet (C-1) | 0.04 g |
| Fluorine-based surfactant MEGAFAC F-780-F, produced by DIC Corp., 30% by weight methyl isobutyl ketone (MIBK) solution | 0.015 g |
| Methyl ethyl ketone | 10.4 g |
| Methanol | 4.83 g |
| 1-Methoxy-2-propanol | 10.4 g |

The structure of Phosphonium compound (A-6), Polymerization initiator (OS-12), Infrared absorbing agent (IRA), Additive (PM-1), Polymerizable compound (AM-1) and Ethyl violet (C-1) are shown below.

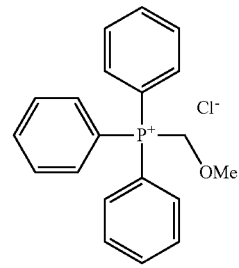
[A-6]

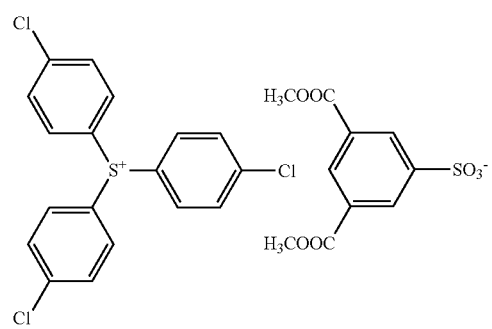
[OS-12]

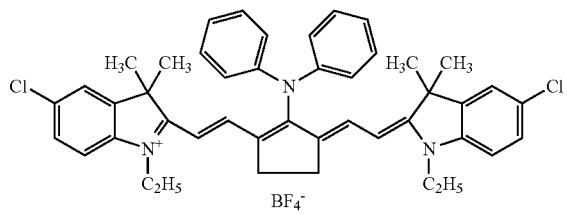
[IR-1]

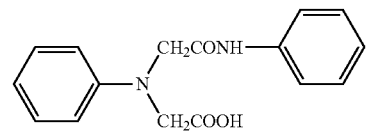
[PM-1]

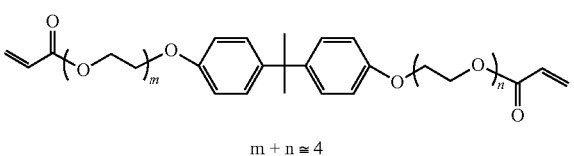
[AM-1]

m + n ≅ 4

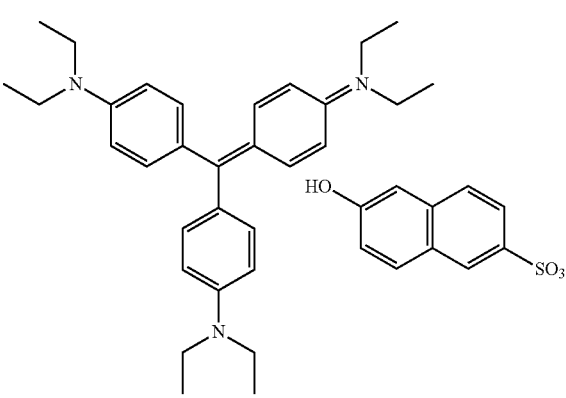
[C-1]

(Formation of Protective Layer)

An aqueous mixed solution (Coating solution (2) for protective layer) comprising synthetic mica (SOMASIF ME-100, 8% by weight aqueous dispersion, produced by CO-OP Chemical Co., Ltd.), a specific polyvinyl alcohol having saponification degree of 91% by mole or more (GOHSELAN CSK-50, sulfonic acid-modified polyvinyl alcohol, saponification degree: 99% by mole, polymerization degree: 300, produced by Nippon Synthetic Chemical Industry Co., Ltd.) and a surfactant (EMALEX 710, produced by Nihon-Emulsion Co., Ltd.) was coated on the surface of the image-recording layer described above by a wire bar and dried in a hot air drying apparatus at 125° C. for 75 seconds.

The content ratio of mica (solid content)/polyvinyl alcohol/surfactant in Coating solution (2) for protective layer was 16/82/2 (% by weight), and the coating amount (coverage after drying) of the protective layer was 1.6 g/m². Thus, lithographic printing plate precursors for Examples (36) to (51) were prepared respectively.

(Evaluation)

The lithographic printing plate precursor obtained was exposed by TRENDSETTER 800II QUANTUM (produced by Creo Co.) at resolution of 2,400 dpi and a rotational number of an external drum of 200 rpm and output of 7 W. The exposure was conducted under conditions of 25° C. and 50% RH. After the exposure, without conducting heat treatment and water washing treatment, the exposed lithographic printing plate precursor was subjected to development processing using an automatic developing machine (LP-1310HII, produced by FUJIFILM Corp.) at a transporting speed (line speed) of 2 m/min and at development temperature of 30° C. The developer used was a solution prepared by diluting DH-N (produced by FUJIFILM Corp.) with water in a ratio of 1:4. The development replenisher used was a solution prepared by diluting FCT-421 (produced by FUJIFILM Corp.) with water in a ratio of 1:1.4. The finisher used was a solution prepared by diluting GN-2K (produced by FUJIFILM Corp.) with water in a ratio of 1:1.

The lithographic printing plate thus-obtained was evaluated in the same manner as in Example 1 described above.

TABLE 14

| | | Printing Durability | | |
|---|---|---|---|---|
| Lithographic Printing Plate Precursor | Star Polymer | Image Area (sheets) (×10⁴) | Halftone Dot | Development Speed (sec) |
| Example 36 | (39) | P-40 | 2.5 | A | 10 |
| Example 37 | (40) | P-41 | 2.5 | A | 7 |
| Example 38 | (41) | P-42 | 2.5 | A | 7 |
| Example 39 | (42) | P-43 | 2.5 | A | 7 |
| Example 40 | (43) | P-44 | 2.5 | A | 7 |
| Example 41 | (44) | P-45 | 2.5 | A | 7 |
| Example 42 | (45) | P-46 | 2.5 | A | 12 |
| Example 43 | (46) | P-47 | 2.3 | A | 9 |
| Example 44 | (47) | P-48 | 2.5 | A | 7 |
| Example 45 | (48) | P-49 | 2.5 | A | 7 |
| Example 46 | (49) | P-50 | 2.5 | A | 7 |
| Example 47 | (50) | P-51 | 2.5 | A | 7 |

TABLE 14-continued

| | | Printing Durability | | |
|---|---|---|---|---|
| Lithographic Printing Plate Precursor | Star Polymer | Image Area (sheets) (×10⁴) | Halftone Dot | Development Speed (sec) |
| Example 48 | (51) | P-52 | 2.5 | A | 8 |
| Example 49 | (52) | P-53 | 2 | A | 10 |
| Example 50 | (53) | P-54 | 2 | A | 10 |
| Example 51 | (54) | P-55 | 2.2 | A | 9 |

What is claimed is:

1. A lithographic printing plate precursor comprising a support having thereon an image-recording layer containing a star polymer, a radical polymerizable compound and a radical polymerization initiator, wherein the star polymer is a star polymer in which a polymer chain is branched from a central skeleton via a sulfide bond, and an acid group and a crosslinkable group are contained in a side chain of the polymer chain, wherein the crosslinkable group is a (meth)acryloyl group, and the acid group is COOH.

2. The lithographic printing plate precursor as described in claim 1, wherein the star polymer is a polymer in which from 3 to 10 polymer chains are branched from the central skeleton.

3. The lithographic printing plate precursor as described in claim 1 or 2, wherein the star polymer is a polymer in which from 3 to 10 polymer chains containing an acid group and a crosslinkable group are branched from the central skeleton via sulfide bonds and which is obtained by polymerization of an ethylenically unsaturated monomer in the presence of a multifunctional thiol.

4. The lithographic printing plate precursor as described in claim 1 or 2, wherein an undercoat layer is provided between the support and the image-recording layer.

5. The lithographic printing plate precursor as described in claim 1 or 2, wherein a protective layer is provided on the image-recording layer.

6. The lithographic printing plate precursor as claimed in claim 1 or 2, wherein an unexposed area of the image-recording layer is capable of being removed with a developer having pH from 2 to 14.

7. The lithographic printing plate precursor as described in claim 5, which is capable of removing after image exposure with laser, the protective layer and an unexposed area of the image-recording layer with one bath of a developer having pH from 2 to 14.

8. A plate making method of a lithographic printing plate precursor comprising exposing imagewise the lithographic printing plate precursor as claimed in claim 6 with laser, and then removing an unexposed area of the image-recording layer with a developer having pH from 2 to 14.

9. A plate making method of a lithographic printing plate precursor comprising exposing imagewise the lithographic printing plate precursor as claimed in claim 7 with laser, and then removing the protective layer and an unexposed area of the image-recording layer with one bath of a developer having pH from 2 to 14.

* * * * *